United States Patent [19]
Tran et al.

(10) Patent No.: US 7,383,485 B2
(45) Date of Patent: Jun. 3, 2008

(54) **FAST MIN\*- OR MAX\*-CIRCUIT IN LDPC (LOW DENSITY PARITY CHECK) DECODER**

(75) Inventors: Hau Thien Tran, Irvine, CA (US); Kelly Brian Cameron, Irvine, CA (US); Ba-Zhong Shen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 555 days.

(21) Appl. No.: 11/172,329

(22) Filed: Jun. 30, 2005

(65) Prior Publication Data

US 2005/0262408 A1    Nov. 24, 2005

Related U.S. Application Data

(63) Continuation-in-part of application No. 10/901,528, filed on Jul. 29, 2004, now Pat. No. 7,017,106, and a continuation-in-part of application No. 10/865,456, filed on Jun. 10, 2004, and a continuation of application No. 10/369,168, filed on Feb. 19, 2003, and a continuation-in-part of application No. 10/347,732, filed on Jan. 21, 2003, which is a continuation-in-part of application No. 09/952,210, filed on Sep. 12, 2001.

(60) Provisional application No. 60/640,579, filed on Dec. 31, 2004, provisional application No. 60/571,655, filed on May 15, 2004, provisional application No. 60/427,979, filed on Nov. 20, 2002, provisional application No. 60/408,978, filed on Sep. 6, 2002, provisional application No. 60/403,847, filed on Aug. 15, 2002, provisional application No. 60/232,053, filed on Sep. 12, 2000, provisional application No. 60/232,288, filed on Sep. 12, 2000.

(51) Int. Cl.
*H03M 13/45* (2006.01)

(52) U.S. Cl. .................................................. 714/780
(58) Field of Classification Search .................. 714/780
See application file for complete search history.

(56) References Cited

U.S. PATENT DOCUMENTS 3,542,756 A    11/1970   Gallager (Continued)

FOREIGN PATENT DOCUMENTS

| EP | 0 735 696 A2 | 10/1996 |
| EP | 0 735 696 A3 | 1/1999 |
| FR | 91 05278 A1 | 10/1992 |

OTHER PUBLICATIONS

R. Gallager, Low-Density Parity-Check Codes, Cambridge, MA: MIT Press, 1963.

(Continued)

*Primary Examiner*—Stephen M. Baker
(74) *Attorney, Agent, or Firm*—Garlick Harrison & Markison; Shayne X. Short

(57) ABSTRACT

Fast min*- (min-star-minus) or max*- (max-star-minus) circuit in LDPC (Low Density Parity Check) decoder. A novel and efficient approach by which certain of the calculations required to perform check node processing within various types of decoders is presented. The functionality and architectures presented herein are applicable to LDPC decoders and may also be employed within other types of decoders that are operable to decode other types of coded signals as well. The parallel and sometimes simultaneous calculation and determination of certain parts of the overall resultant of the max*- and/or min*- processing allows for very fast operation when compared to prior art approaches.

32 Claims, 22 Drawing Sheets

U.S. PATENT DOCUMENTS

| | | | |
|---|---|---|---|
| 3,665,396 | A | 5/1972 | Forney, Jr. |
| 4,295,218 | A | 10/1981 | Tanner |
| 5,406,570 | A | 4/1995 | Berrou et al. |
| 5,446,747 | A | 8/1995 | Berrou |
| 5,563,897 | A | 10/1996 | Pyndiah et al. |
| 6,065,147 | A | 5/2000 | Pyndiah et al. |
| 6,119,264 | A | 9/2000 | Berrou et al. |
| 6,122,763 | A | 9/2000 | Pyndiah et al. |
| 6,430,233 | B1 | 8/2002 | Dillon et al. |
| 6,473,010 | B1 | 10/2002 | Vityaev et al. |
| 6,567,465 | B2 | 5/2003 | Goldstein et al. |
| 6,633,856 | B2 | 10/2003 | Richardson et al. |
| 6,725,409 | B1 | 4/2004 | Wolf |
| 6,757,701 | B2 * | 6/2004 | Sivan et al. ............... 708/277 |
| 6,760,390 | B1 * | 7/2004 | Desai et al. ............... 375/341 |
| 6,772,389 | B2 * | 8/2004 | Kim et al. ............... 714/780 |
| 6,775,801 | B2 * | 8/2004 | Wolf et al. ............... 714/755 |
| 6,798,366 | B1 * | 9/2004 | Widdup ............... 341/106 |
| 6,895,711 | B1 * | 5/2005 | Nakamichi ............... 43/42.53 |
| 2003/0002603 | A1 | 1/2003 | Worm et al. |
| 2003/0104788 | A1 | 6/2003 | Kim |
| 2004/0005019 | A1 | 1/2004 | Smith et al. |

OTHER PUBLICATIONS

M. Luby, M. Mitzenmacher, M. A. Shokrollahi, D. A. Spielman, and V. Stemann, "Practical Loss-Resilient Codes", Proc. 29 th Symp. on Theory of Computing, 1997, pp. 150-159.

T. J. Richardson and R. L. Urbanke, "The capacity of low-density parity-check code under message-passing decoding," IEEE Trans. Inform. Theory, vol. 47, pp. 599-618, Feb. 2001.

Draft ETSI EN 302 307 V1.1.1 (Jun. 2004), Digital Video Broadcasting (DVB); Second generation framing structure, channel coding and modulation systems for Broadcasting, Interactive Services, News Gathering and other broadband satellite applications.

ETSI EN 302 307 V1.1.1 (Mar. 2005), Digital Video Broadcasting (DVB); Second generation framing structure, channel coding and modulation systems for Broadcasting, Interactive Services, News Gathering and other broadband satellite applications.

R. G. Gallager, "Low density parity check codes," IRE Trans. Info. Theory, vol. IT-8, pp. 21-28, Jan. 1962.

J. Hagenauer, E. Offer, and L. Papke, "Iterative decoding of binary block and convolutional codes," IEEE Transactions on Information Theory, pp. 429-445, Mar. 1996.

Mittelholzer, et al., "Reduced complexity decoding of low density parity check codes for generalized partial response channels," IEEE Tran. on Magnetics, vol. 37, No. 2, pp. 721-778, Mar. 2001.

P. Robertson, E. Villebrum, and P. Hoeher, "A comparison of optimal and suboptimal MAP decoding algorithms operating in the log domain," in Proc. Int. Conf. Communications, Seattle, WA, Jun. 1995, pp. 1009-1013.

Andrew J. Viterbi, "An Intuitive Justification and a Simplified Implementation of the MAP Decoder for Convolutional Codes," IEEE Journal on Selected Areas in Communications, vol. 16, No. 2, pp. 260 - 264, Feb. 1998.

Xiao et al. "Efficient implementation of the sum-product algorithm for decoding LDPC," 2001 IEEE, pp. 1036-1036E.

Seog et al., "State-parallel MAP module design for turbo decoding of 3GPP," Apr. 2002, Journal of the Korean Physical Society, vol. 40, No. 4, pp. 677-685.

* cited by examiner

| z | z (binary) | +ln(1+e^(-|z|)) | log_out (binary) |
|---|---|---|---|
| 3.75 | 01111 | 0.02 | 000 |
| 3.50 | 01110 | 0.03 | 000 |
| 3.25 | 01101 | 0.04 | 000 |
| 3.00 | 01100 | 0.05 | 000 |
| 2.75 | 01011 | 0.06 | 000 |
| 2.50 | 01010 | 0.08 | 000 |
| 2.25 | 01001 | 0.10 | 000 |
| 2.00 | 01000 | 0.13 | 000 |
| 1.75 | 00111 | 0.16 | 000 |
| 1.50 | 00110 | 0.20 | 000 |
| 1.25 | 00101 | 0.25 | 001 |
| 1.00 | 00100 | 0.31 | 001 |
| 0.75 | 00011 | 0.39 | 001 |
| 0.50 | 00010 | 0.47 | 001 |
| 0.25 | 00001 | 0.58 | 010 |
| 0.00 | 00000 | 0.69 | 010 |
| -0.25 | 11111 | 0.58 | 010 |
| -0.50 | 11110 | 0.47 | 001 |
| -0.75 | 11101 | 0.39 | 001 |
| -1.00 | 11100 | 0.31 | 001 |
| -1.25 | 11011 | 0.25 | 001 |
| -1.50 | 11010 | 0.20 | 000 |
| -1.75 | 11001 | 0.16 | 000 |
| -2.00 | 11000 | 0.13 | 000 |
| -2.25 | 10111 | 0.10 | 000 |
| -2.50 | 10110 | 0.08 | 000 |
| -2.75 | 10101 | 0.06 | 000 |
| -3.00 | 10100 | 0.05 | 000 |
| -3.25 | 10011 | 0.04 | 000 |
| -3.50 | 10010 | 0.03 | 000 |
| -3.75 | 10001 | 0.02 | 000 |
| -4.00 | 10000 | 0.02 | 000 |

| z | z (binary) | +ln(1−e^−|z|) | log_out (binary) |
|---|---|---|---|
| 3.75 | 01111 | -0.02 | 00000 |
| 3.50 | 01110 | -0.03 | 00000 |
| 3.25 | 01101 | -0.04 | 00000 |
| 3.00 | 01100 | -0.05 | 00000 |
| 2.75 | 01011 | -0.07 | 00000 |
| 2.50 | 01010 | -0.09 | 00000 |
| 2.25 | 01001 | -0.11 | 00000 |
| 2.00 | 01000 | -0.15 | 00000 |
| 1.75 | 00111 | -0.19 | 00000 |
| 1.50 | 00110 | -0.25 | 11111 |
| 1.25 | 00101 | -0.34 | 11111 |
| 1.00 | 00100 | -0.46 | 11111 |
| 0.75 | 00011 | -0.64 | 11110 |
| 0.50 | 00010 | -0.93 | 11101 |
| 0.25 | 00001 | -1.51 | 11010 |
| 0.00 | 00000 | -2.14* | 11000* |
| -0.25 | 11111 | -1.51 | 11010 |
| -0.50 | 11110 | -0.93 | 11101 |
| -0.75 | 11101 | -0.64 | 11110 |
| -1.00 | 11100 | -0.46 | 11111 |
| -1.25 | 11011 | -0.34 | 11111 |
| -1.50 | 11010 | -0.25 | 11111 |
| -1.75 | 11001 | -0.19 | 00000 |
| -2.00 | 11000 | -0.15 | 00000 |
| -2.25 | 10111 | -0.11 | 00000 |
| -2.50 | 10110 | -0.09 | 00000 |
| -2.75 | 10101 | -0.07 | 00000 |
| -3.00 | 10100 | -0.05 | 00000 |
| -3.25 | 10011 | -0.04 | 00000 |
| -3.50 | 10010 | -0.03 | 00000 |
| -3.75 | 10001 | -0.02 | 00000 |
| -4.00 | 10000 | -0.02 | 00000 |

Fig. 11

FAST MIN*- OR MAX*-CIRCUIT IN LDPC (LOW DENSITY PARITY CHECK) DECODER

CROSS REFERENCE TO RELATED PATENTS/PATENT APPLICATIONS

Provisional Priority Claims

The present U.S. Utility patent application claims priority pursuant to 35 U.S.C. § 119(e) to the following U.S. Provisional Patent Application which is hereby incorporated herein by reference in its entirety and made part of the present U.S. Utility patent application for all purposes:
 1. U.S. Provisional Application Ser. No. 60/640,579, "Fast min*- or max*- circuit in LDPC (Low Density Parity Check) decoder," filed Dec. 31, 2004 (Dec. 31, 2004), pending.

CIP of BP1425.4CIP

The present U.S. Utility patent application also claims priority pursuant to 35 U.S.C. § 120, as a continuation-in-part (CIP), to the following U.S. Utility patent application which is hereby incorporated herein by reference in its entirety and made part of the present U.S. Utility patent application for all purposes:
 1. U.S. Utility patent application Ser. No. 10/865,456, entitled "Decoder design adaptable to decode coded signals using min* or max* processing," filed Jun. 10, 2004 (Jun. 10, 2004), pending

BP1425.4CIP is a CIP of BP1425.4

The U.S. Utility patent application Ser. No. 10/865,456 claims priority pursuant to 35 U.S.C. § 119(e) to the following U.S. Provisional Patent Application which is hereby incorporated herein by reference in its entirety and made part of the present U.S. Utility patent application for all purposes:
 1. U.S. Provisional Patent Application Ser. No. 60/571,655, entitled "Decoder design adaptable to decode coded signals using min* or max* processing," filed May 15, 2004 (May 15, 2004), pending.

The U.S. Utility patent application Ser. No. 10/865,456 also claims priority pursuant to 35 U.S.C. § 120, as a continuation-in-part (CIP), to the following U.S. Utility patent application which is hereby incorporated herein by reference in its entirety and made part of the present U.S. Utility patent application for all purposes:
 1. U.S. Utility patent application Ser. No. 09/952,210, entitled "Method and apparatus for min star calculations in a MAP decoder," filed Sep. 12, 2001 (Sep. 12, 2001), pending, which claims priority pursuant to 35 U.S.C. § 119(e) to the following U.S. Provisional Patent Applications which are hereby incorporated herein by reference in their entirety and made part of the present U.S. Utility patent application for all purposes:
  a. U.S. Provisional Patent Application Ser. No. 60/232,053, entitled "Turbo trellis encoder and decoder," filed Sep. 12, 2000 (Sep. 12, 2000), pending.
  b. U.S. Provisional Patent Application Ser. No. 60/232,288, entitled "Parallel concatenated code with SISO interactive turbo decoder," filed Sep. 12, 2000 (Sep. 12, 2000), pending.

CIP of BP2541

The present U.S. Utility patent application also claims priority pursuant to 35 U.S.C. § 120, as a continuation-in-part (CIP), to the following U.S. Utility Patent Application which is hereby incorporated herein by reference in its entirety and made part of the present U.S. Utility patent application for all purposes:
 1. U.S. Utility patent application Ser. No. 10/347,732, entitled "Inverse function of min*: min*- (inverse function of max*: max*-)," filed Jan. 21, 2003 (Jan. 21, 2003), pending, which claims priority pursuant to 35 U.S.C. § 119(e) to the following U.S. Provisional Patent Applications which are hereby incorporated herein by reference in their entirety and made part of the present U.S. Utility patent application for all purposes:
  a. U.S. Provisional Application Ser. No. 60/403,847, entitled "Inverse of min*: min*- (the inverse of max*: max*-)," filed Aug. 15, 2002 (Aug. 15, 2002).
  b. U.S. Provisional Application Ser. No. 60/427,979, "Single stage implementation of min*, max*, min and/or max to perform state metric calculation in SISO decoder," filed Nov. 20, 2002 (Nov. 20, 2002).

CIP of BP2559CON

The present U.S. Utility patent application also claims priority pursuant to 35 U.S.C. § 120, as a continuation-in-part (CIP), to the following U.S. Utility Patent Application which is hereby incorporated herein by reference in its entirety and made part of the present U.S. Utility patent application for all purposes:
 1. U.S. Utility patent application Ser. No. 10/901,528, entitled "Low Density Parity Check (LDPC) code decoder using min*, min**, max* or max** and their respective inverses," filed Jul. 29, 2004 (Jul. 29, 2004) now U.S. Pat. No. 7,017,106, pending.

BP2559CON is a CON of BP2559

The U.S. Utility patent application Ser. No. 10/901,528 claims priority pursuant to 35 U.S.C. § 120, as a continuation, to the following U.S. Utility patent application which is hereby incorporated herein by reference in its entirety and made part of the present U.S. Utility patent application for all purposes:
 1. U.S. Utility patent application Ser. No. 10/369,168, entitled "Low Density Parity Check (LDPC) code decoder using min*, min**, max* or max** and their respective inverses," filed Feb. 19, 2003 (Feb. 19, 2003), pending, which claims priority pursuant to 35 U.S.C. § 119(e) to the following U.S. Provisional Patent Applications which are hereby incorporated herein by reference in their entirety and made part of the present U.S. Utility patent application for all purposes:
  a. U.S. Provisional Application Ser. No. 60/403,847, entitled "Inverse of min*: min*- (the inverse of max*: max*-)," filed Aug. 15, 2002 (Aug. 15, 2002).
  b. U.S. Provisional Application Ser. No. 60/408,978, entitled "Low Density Parity Check (LDPC) Code Decoder using min*, min*-, min, and/or min-," filed Sep. 6, 2002 (Sep. 6, 2002).
  c. U.S. Provisional Application Ser. No. 60/427,979, "Single stage implementation of min*, max*, min and/or max to perform state metric calculation in SISO decoder," filed Nov. 20, 2002 (Nov. 20, 2002).

BACKGROUND OF THE INVENTION

1. Technical Field of the Invention

The invention relates generally to communication systems; and, more particularly, it relates to decoding of signals within such communication systems.

2. Description of Related Art

Data communication systems have been under continual development for many years. One such type of communication system that has been of significant interest lately is a communication system that employs turbo codes. Another type of communication system that has also received interest is a communication system that employs LDPC (Low Density Parity Check) code. Each of these different types of communication systems is able to achieve relatively low BERs (Bit Error Rates).

A continual and primary directive in this area of development has been to try continually to lower the error floor within a communication system. The ideal goal has been to try to reach Shannon's limit in a communication channel. Shannon's limit may be viewed as being the data rate to be used in a communication channel, having a particular SNR (Signal to Noise Ratio), that achieves error free transmission through the communication channel. In other words, the Shannon limit is the theoretical bound for channel capacity for a given modulation and code rate.

LDPC codes are oftentimes referred to in a variety of ways. For example, iterative soft decoding of LDPC codes may be implemented in a number of ways including based on the BP (Belief Propagation) algorithm, the SP (Sum-Product) algorithm, and/or the MP (Message-Passing) algorithm; the MP algorithm is sometimes referred to as a Sum Product/Belief Propagation combined algorithm. While there has been a significant amount of interest and effort directed towards these types of LDPC codes, regardless of which particular manner of iterative decoding algorithm is being employed in the specific case (3 of which are enumerated above: BP, SP, and MP), there still is ample room for improvement in the implementation and processing to be performed within a communication device to complete such decoding. For example, there are a variety of relatively complex and numerically burdensome calculations, data management and processing that must be performed to effectuate the accurate decoding of an LDPC coded signal.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code of a length of one million, it nevertheless demonstrates the very promising application of LDPC codes within communication systems.

In performing calculations when decoding a received signal, it is common for decoders to operate in the natural log (ln) domain (i.e., the logarithm domain having base e); this is sometimes referred to as simply the "log domain." LDPC decoders also fall in to this category. By operating within the log domain, this converts all multiplications to additions, divisions to subtractions, and eliminates exponentials entirely, without affecting BER performance.

One somewhat difficult calculation is the natural log (ln) domain includes calculating the sum of exponentials as shown below:

$$\ln(e^a+e^b+e^c+\ldots)$$

This calculation can be significantly reduced in complexity using the Jacobian formula shown below:

$$\max^*(a,b)=\ln(e^a+e^b)=\max(a,b)+\ln(1+e^{-|a-b|})$$

This calculation is oftentimes referred to as being a max* calculation or max* operation. It is noted that the Jacobian formula simplification of the equation shown above presents the max* operation of only two variables, a and b. This calculation may be repeated over and over when trying to calculate a longer sum of exponentials. For example, to calculate $\ln(e^a+e^b+e^c)$, the following two max* operations may be performed:

$$\max^*(a,b)=\ln(e^a+e^b)=\max(a,b)+\ln(1+e^{-|a-b|})=x$$

$$\max^*(a,b,c)=\max^*(x,c)=\ln(e^x+e^c)=\max(x,c)+\ln(1+e^{-|x-c|})$$

While there has been a great deal of development within the context of LDPC code, the extensive processing and computations required to perform decoding therein can be extremely burdensome. This one example provided above, of the calculating the sum of exponentials, illustrates the potentially complex and burdensome calculations needed when performing decoding of such signals. Sometimes the processing requirements are so burdensome that they simply prohibit their implementation within systems having very tight design budgets.

There have been some non-optimal approaches to deal with the burdensome calculations required to do such burdensome calculations. For example, in performing this basic max* operation, some decoders simply exclude the logarithmic correction factor of $\ln(1+e^{-|a-b|})$ altogether and use only the max(a,b) result which may be implemented within a single instruction within a DSP (Digital Signal Processor). However, this will inherently introduce some degradation in decoder performance given this lack of precision in the calculations. Most of the common approaches that seek to provide some computational improvements either cut corners in terms of computational accuracy, or they do not provide a sufficient reduction in computational complexity to justify their integration. One of the prohibiting factors concerning the implementation of many LDPC codes is oftentimes the inherent computational complexity coupled with the significant amount of memory required therein.

There still exists a need in the art to provide for more efficient solutions when making calculations, such as max*, within decoders that operate within the logarithmic domain.

The use of LDPC coded signals continues to be explored within many newer application areas. One such application area is that digital video broadcasting. The Digital Video Broadcasting Project (DVB) is an industry-led consortium of over 260 broadcasters, manufacturers, network operators, software developers, regulatory bodies and others in over 35 countries committed to designing global standards for the global delivery of digital television and data services. Publicly available information concerning the DVB is available at the following Internet address:

"http://www.dvb.org/"

The DVB-S2 (i.e., DVB-Satellite Version 2) draft standard is also publicly available via this Internet address, and the DVB-S2 draft standard may be downloaded in Adobe PDF format at the following Internet address:

"http://www.dvb.org/documents//
en302307.v1.1.1.draft.pdf"

The entire contents of this DVB-S2 draft standard, "Draft ETSI EN 302 307 V1.1.1 (2004-06), Digital Video Broadcasting (DVB); Second generation framing structure, channel coding and modulation systems for Broadcasting, Interactive Services, News Gathering and other broadband satellite applications" is hereby incorporated herein by reference in its entirety and made part of the present disclosure for all purposes.

In addition, the standard "ETSI EN 302 307 V1.1.1 (2005-03), Digital Video Broadcasting (DVB); Second generation framing structure, channel coding and modulation systems for Broadcasting, Interactive Services, News Gathering and other broadband satellite applications" was formally ratified by the ETSI (European Telecommunications Standards Institute) in March 2005. The entire contents of this standard is hereby incorporated herein by reference in its entirety and made part of the present disclosure for all purposes.

Greater detail regarding the types of signals employed within such DVB-S2 compliant systems is included within this DVB-S2 standard. The DVB-S2 standard focuses primarily on the transmission system description and the subsystems therein including mode adaptation, stream adaptation, FEC encoding (including both BCH outer encoding and LDPC inner encoding), bit mapping into constellation, physical layer framing, and baseband shaping and quadrature modulation.

The DVB-S2 is an advanced version of DVB-S (the first standard produced by the Digital Video Broadcasting Project). DVB-S2 seeks to provide for greater efficiency than DVB-S. DVB-S2 plans to implement 4 different modulation types: QPSK (Quadrature Phase Shift Key), 8 PSK (Phase Shift Key), 16 APSK (Asymmetric Phase Shift Keying), and 32 APSK. Generally speaking, the QPSK and 8 PSK modulation types are intended for broadcast applications through non-linear satellite transponders driven near to saturation; the 16 APSK and 32. APSK modulation types are geared more primarily towards professional applications requiring semi-linear transponders. The 16 APSK and 32 APSK modulation types operate by trading off power efficiency for greater throughput.

In addition, DVB-S2 uses a powerful FEC (Forward Error Correction) system based on concatenation of BCH (Bose-Chaudhuri-Hocquenghem) outer coding with LDPC inner coding. The result is performance which is at times only 0.7 dB from the Shannon limit. The choice of FEC parameters depends on the system requirements. With VCM (Variable Coding and Modulation) and ACM (Adaptive Coding and Modulation), the code rates can be changed dynamically, on a frame by frame basis.

The multiple operational parameters to which a receiving device, that includes a decoder, must operate to be DVB-S2 compliant is very clearly laid out by the operational parameters of the transmission system description. However, as long as a receiving device, that includes a decoder, complies with these operational parameters specified within the DVB-S2 standard, great latitude in the means of implementation is permissible. The generation of signals on the transmission end of a communication channel is clearly laid out within the DVB-S2 standard, and the means by which the receive processing of such signal (at the receiving end of a communication channel) may be performed is widely open to the designer. Clearly, a key design constrain of such receiving devices is to provide for the accommodation of such DVB-S2 signals while providing for very high performance while occupying a relatively small amount of area and having a relatively lower level of complexity.

Another application area in which the use of LDPC coded signals continues to be explored is in various communication system embodiments and application areas whose operation is specified and governed by the IEEE (Institute of Electrical & Electronics Engineers). For example, the use of LDPC coded signals has been of significant concern within the IEEE P802.3an (10GBASE-T) Task Force. This IEEE P802.3an (10GBASE-T) Task Force has been created by the IEEE to develop and standardize a copper 10 Giga-bit Ethernet standard that operates over twisted pair cabling according the IEEE 802.3 CSMA/CD Ethernet protocols. Carrier Sense Multiple Access/Collision Detect (CSMA/CD) is the protocol for carrier transmission access in Ethernet networks. IEEE 802.3an (10GBASE-T) is an emerging standard for 10 Gbps Ethernet operation over 4 wire twisted pair cables. More public information is available concerning the IEEE P802.3an (10GBASE-T) Task Force at the following Internet address:

"http://www.ieee802.org/3/an/".

This high data rate provided in such applications is relatively close to the theoretical maximum rate possible over the worst case 100 meter cable. Near-capacity achieving error correction codes are required to enable 10 Gbps operation. The latency constraints, which would be involved by using traditional concatenated codes, simply preclude their use in such applications.

Typical encoding and modulation of LDPC coded signals is performed by generating a signal that includes symbols each having a common code rate and being mapped to a singular modulation (e.g., a singular constellation shape having a singular mapping of the constellation points included therein). That is to say, all of the symbols of such an LDPC coded modulation signal have the same code rate and the same modulation (the same constellation shape whose constellation points have the singular mapping). Oftentimes, such prior art designs are implemented as to maximize the hardware and processing efficiencies of the particular design employed to generate the LDPC coded signal having the single code rate and single modulation for all of the symbols generated therein.

However, in some more recent prior art LDPC communication systems, the design of LDPC encoders has sought to provide for capabilities to generate multiple types of LDPC coded signals. Within these communication systems, the code rate and modulation type for all of the symbols within any given LDPC block is the same. That is to say, the entire block has a particular code rate and modulation type associated with it. Nevertheless, the encoder is operable to generate different LDPC blocks such that a first LDPC block has a first code rate and first modulation type associated with it, and a second LDPC block has a second code rate and second modulation type associated with it.

A decoder that operates to decode such signals must be able to accommodate the various LDPC block types that it may receive. Currently, the LDPC decoder designs being discussed in the art require a relatively large amount of area and are of a relatively high complexity. There is a need in the art to provide for an LDPC decoder that can accommodate such signals while providing for very high performance, less area, and less complexity.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL
VIEWS OF THE DRAWINGS

FIG. 11 is a diagram illustrating an embodiment of a max*− log table according to certain aspects of the invention.

Figure 14:
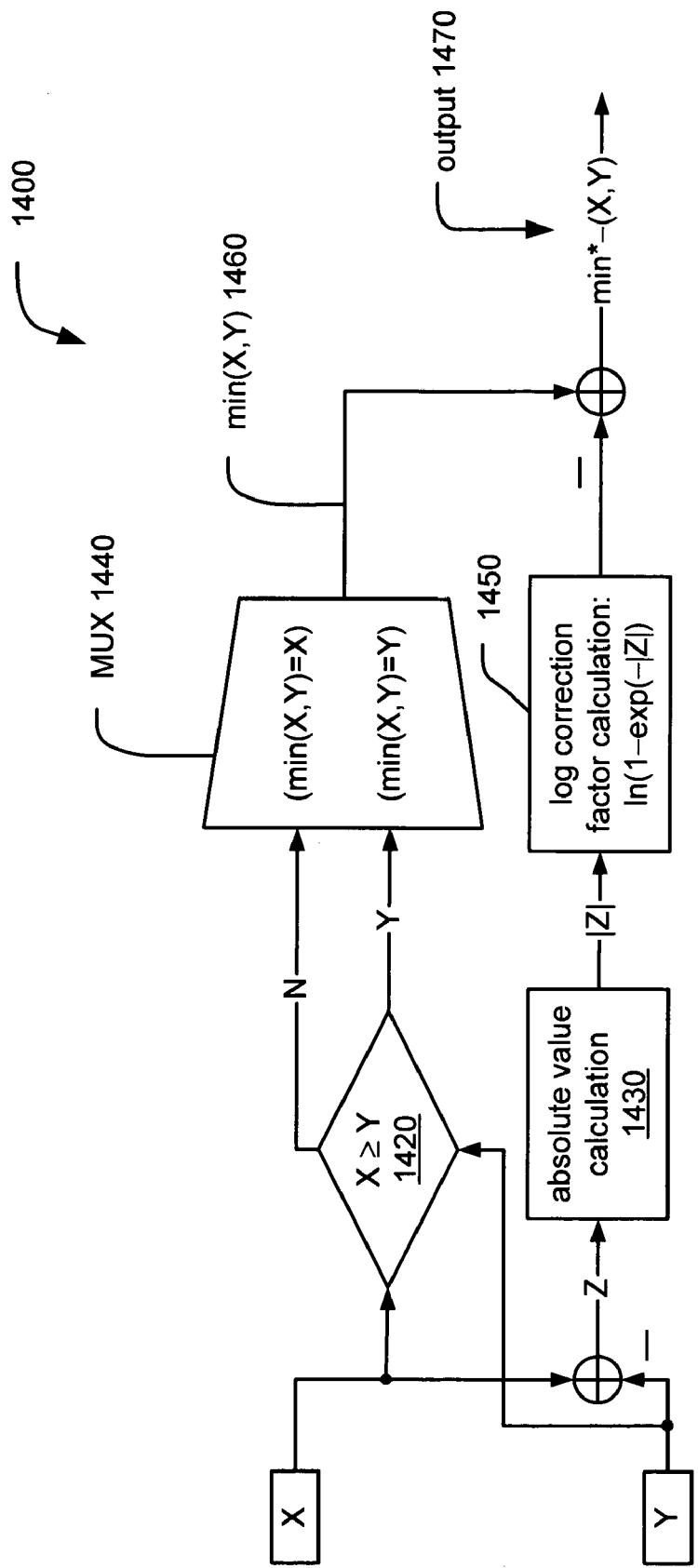
Figure 15:
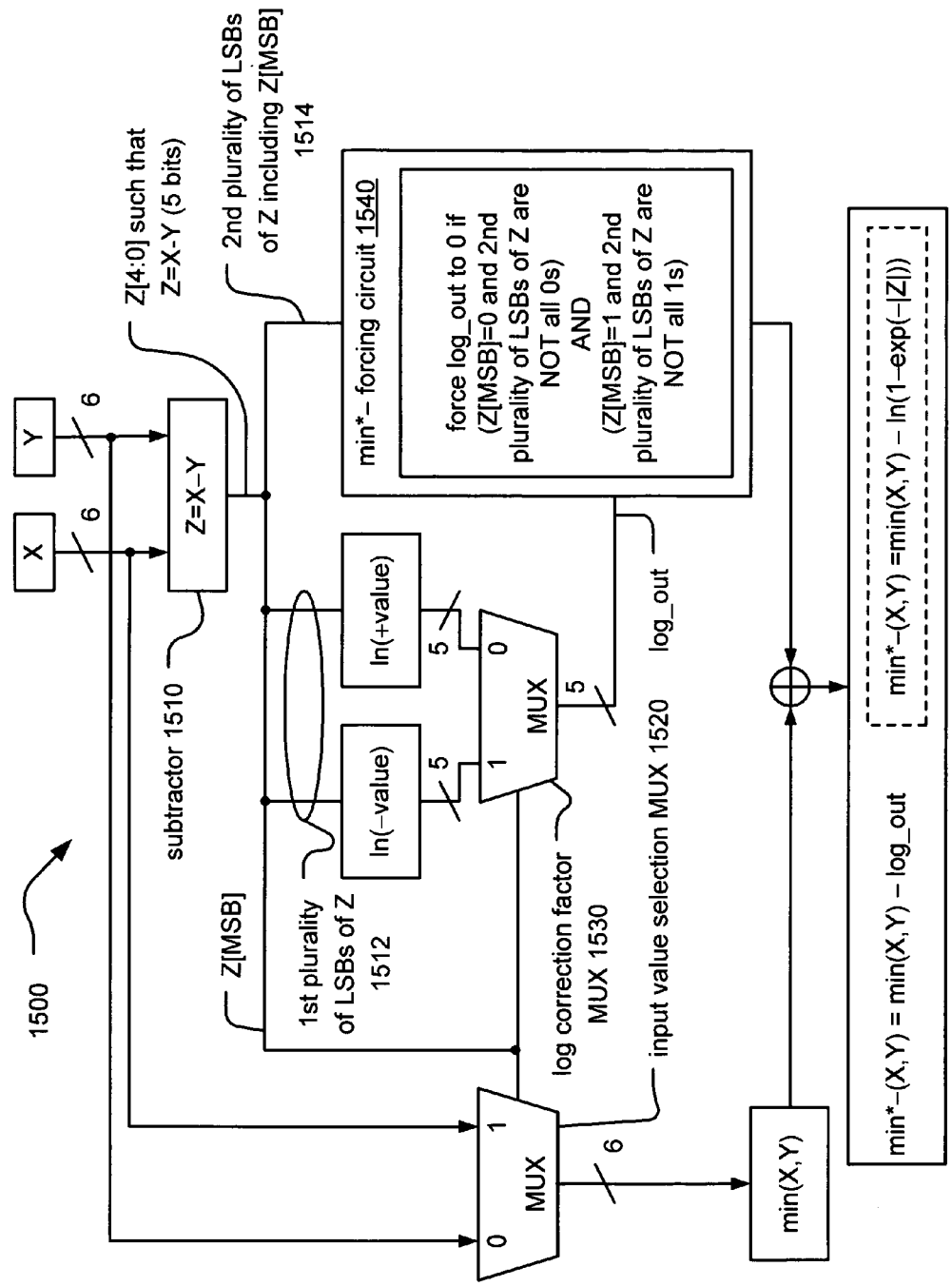
Figure 16:
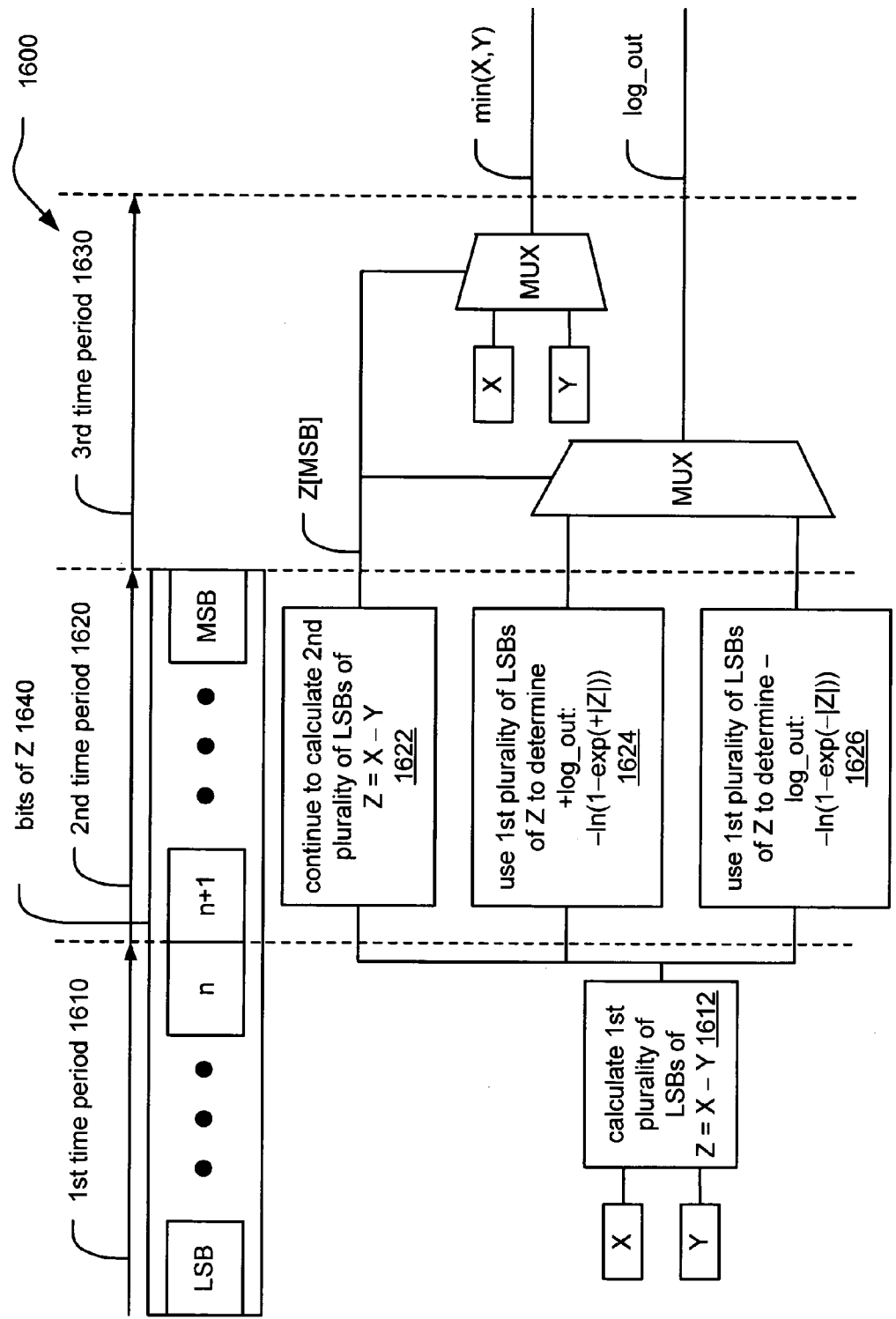

FIG. 14, FIG. 15, and FIG. 16 are diagrams illustrating various alternative embodiments of min− processing functionality according to certain aspects of the invention.

Figure 17:
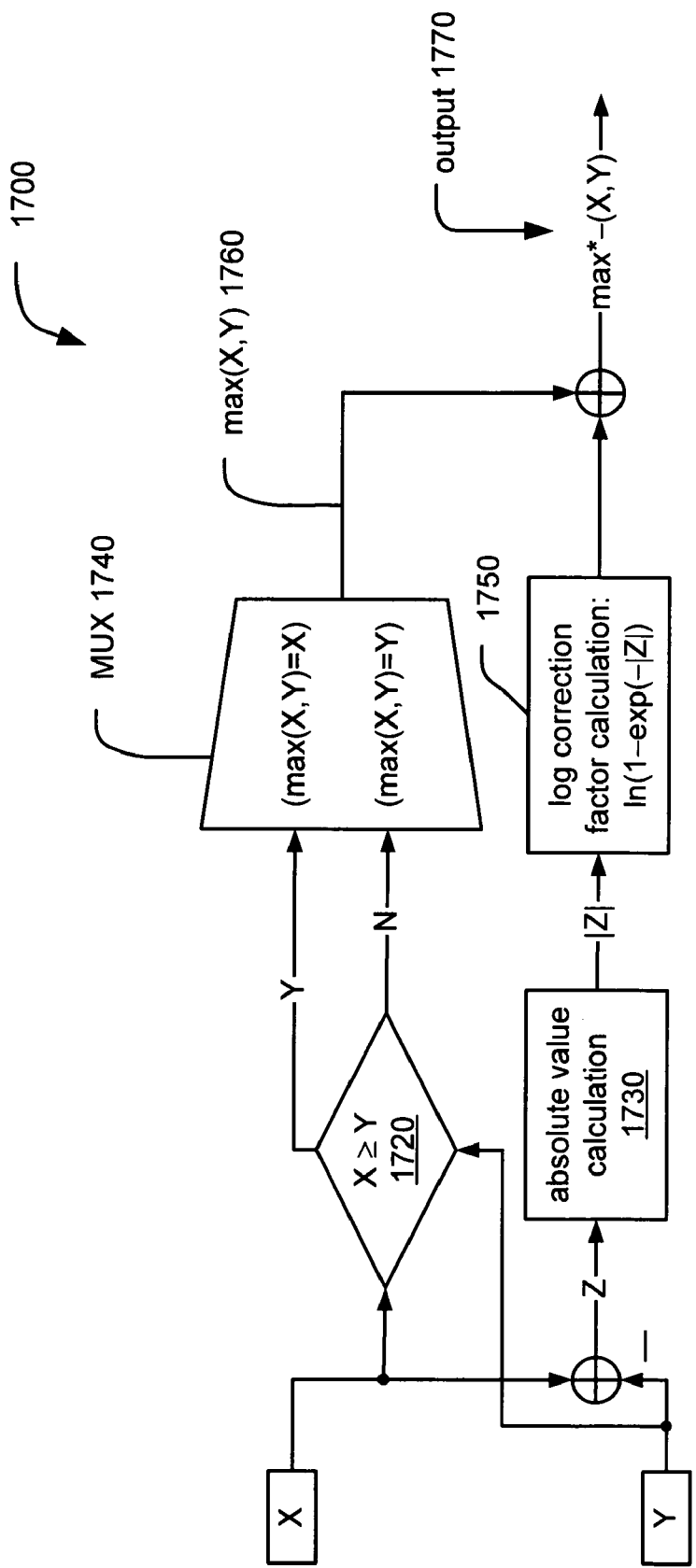
Figure 18:
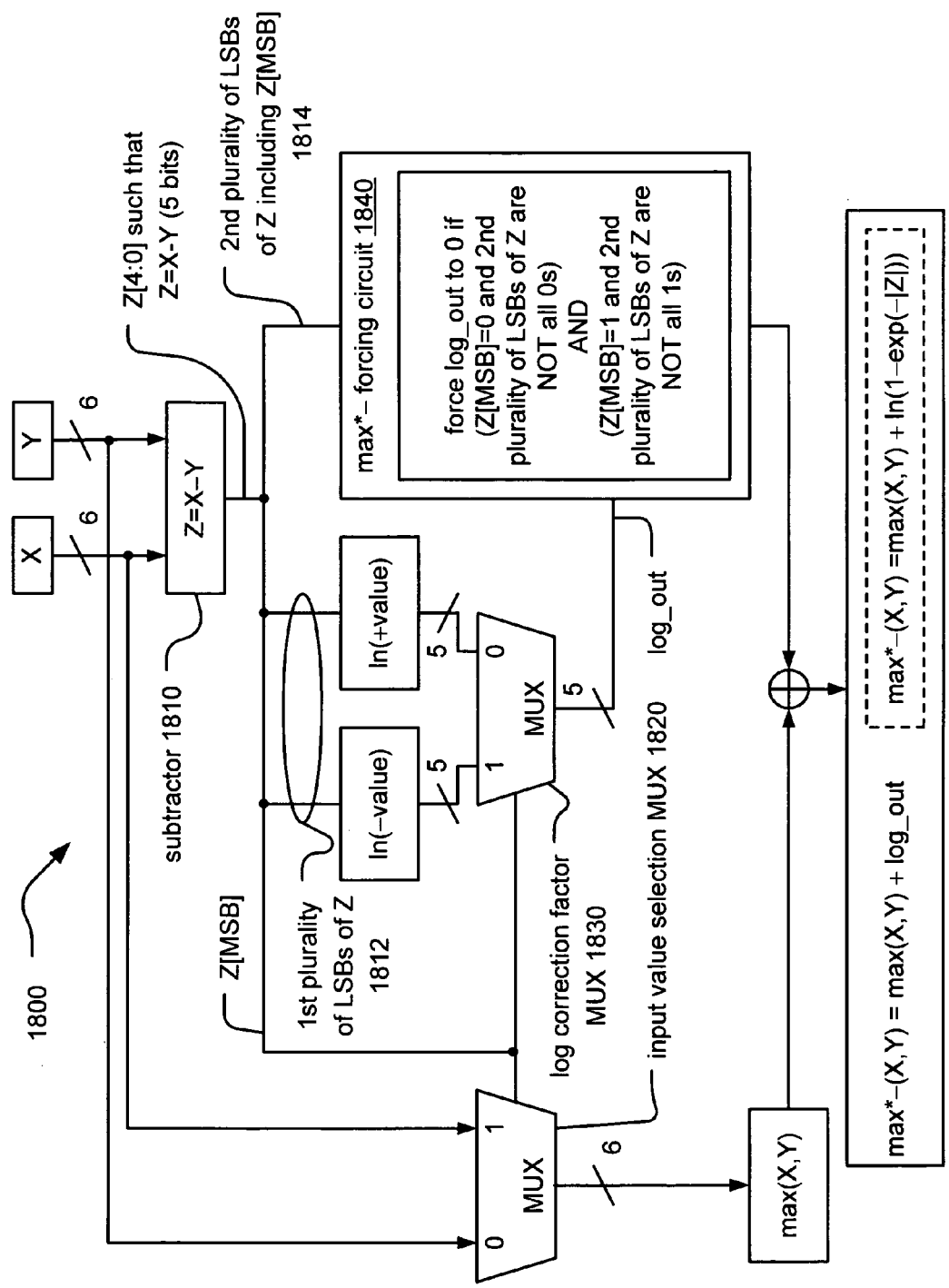
Figure 19:
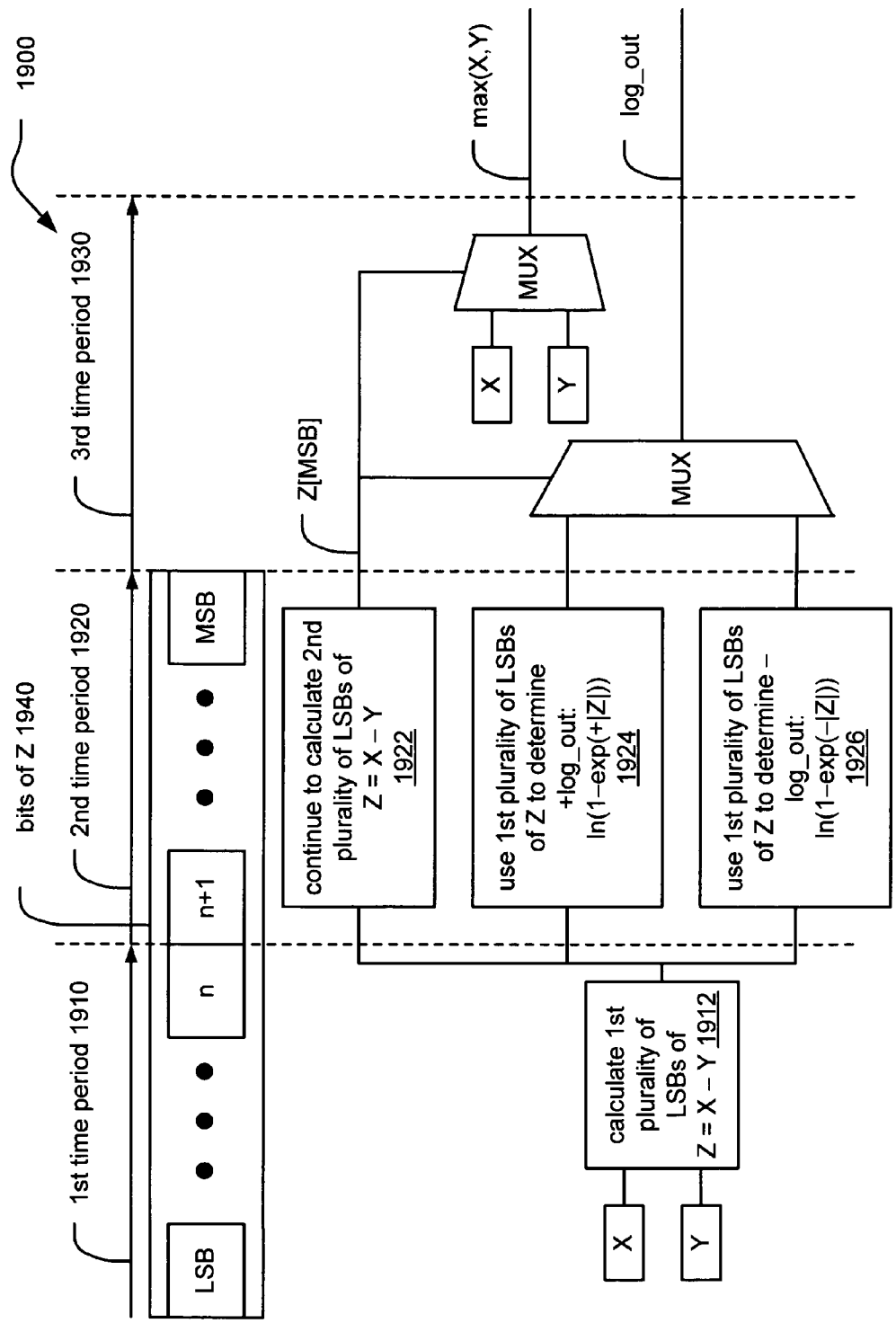

FIG. 17, FIG. 18, and FIG. 19 are diagrams illustrating various alternative embodiments of max− processing functionality according to certain aspects of the invention.

Figure 20:
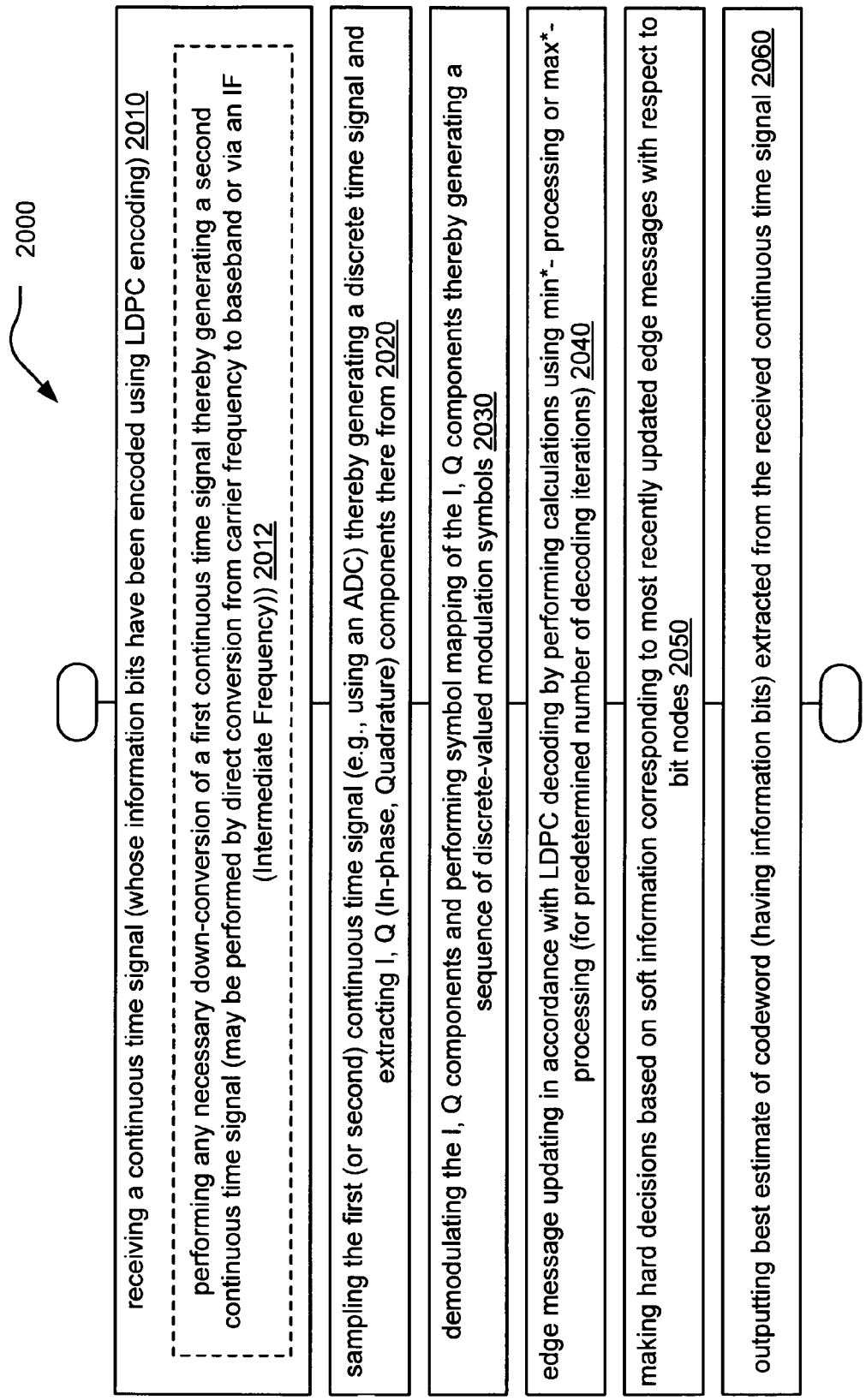

FIG. 20 is a flowchart illustrating an embodiment of a method for decoding LDPC coded signals by employing min*− processing or max*− processing in accordance with certain aspects of the invention.

Figure 21:
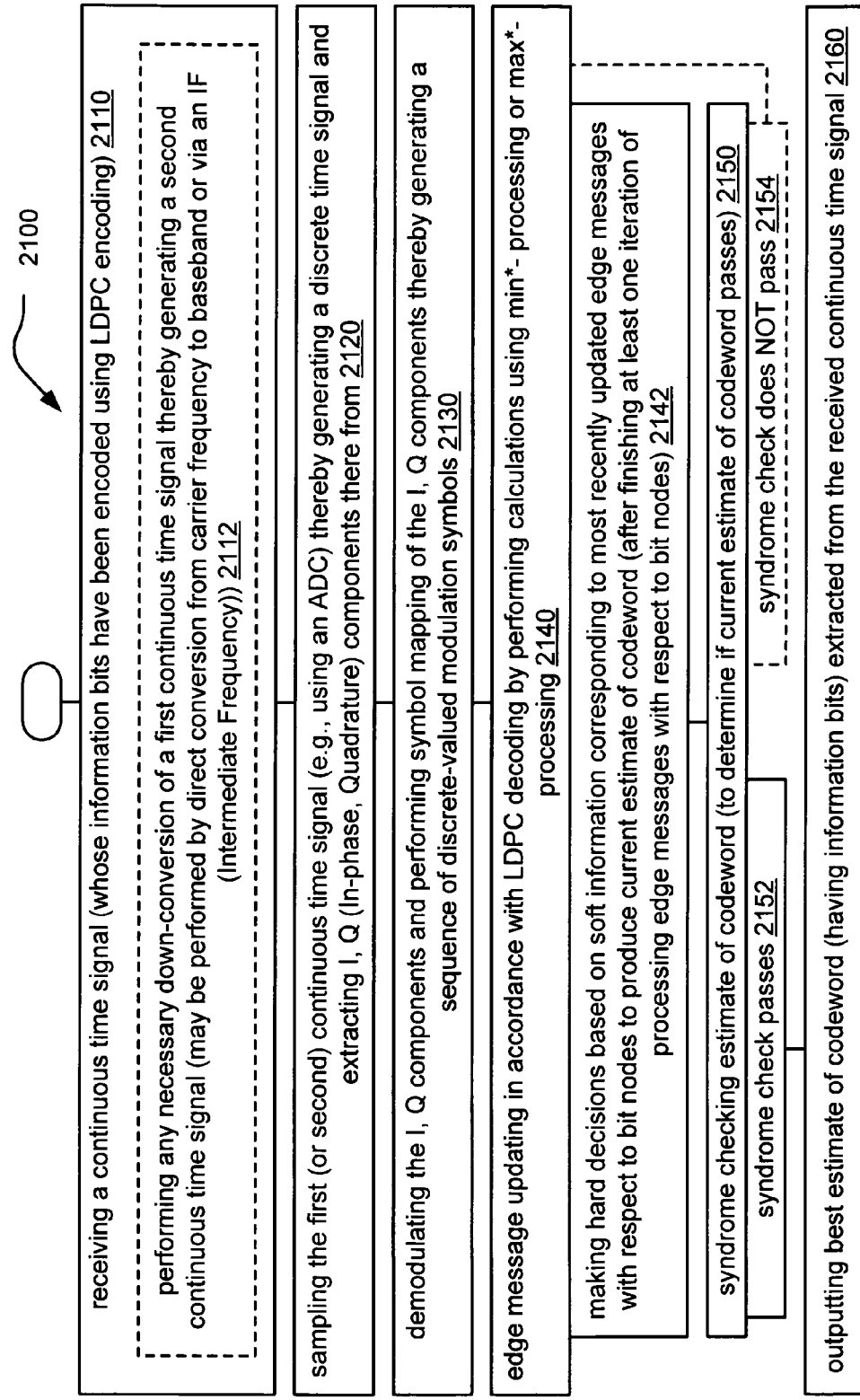

FIG. 21 is a flowchart illustrating an embodiment of an alternative method for decoding LDPC coded signals by employing min*− processing or max*− processing in accordance with certain aspects of the invention.

Figure 22:
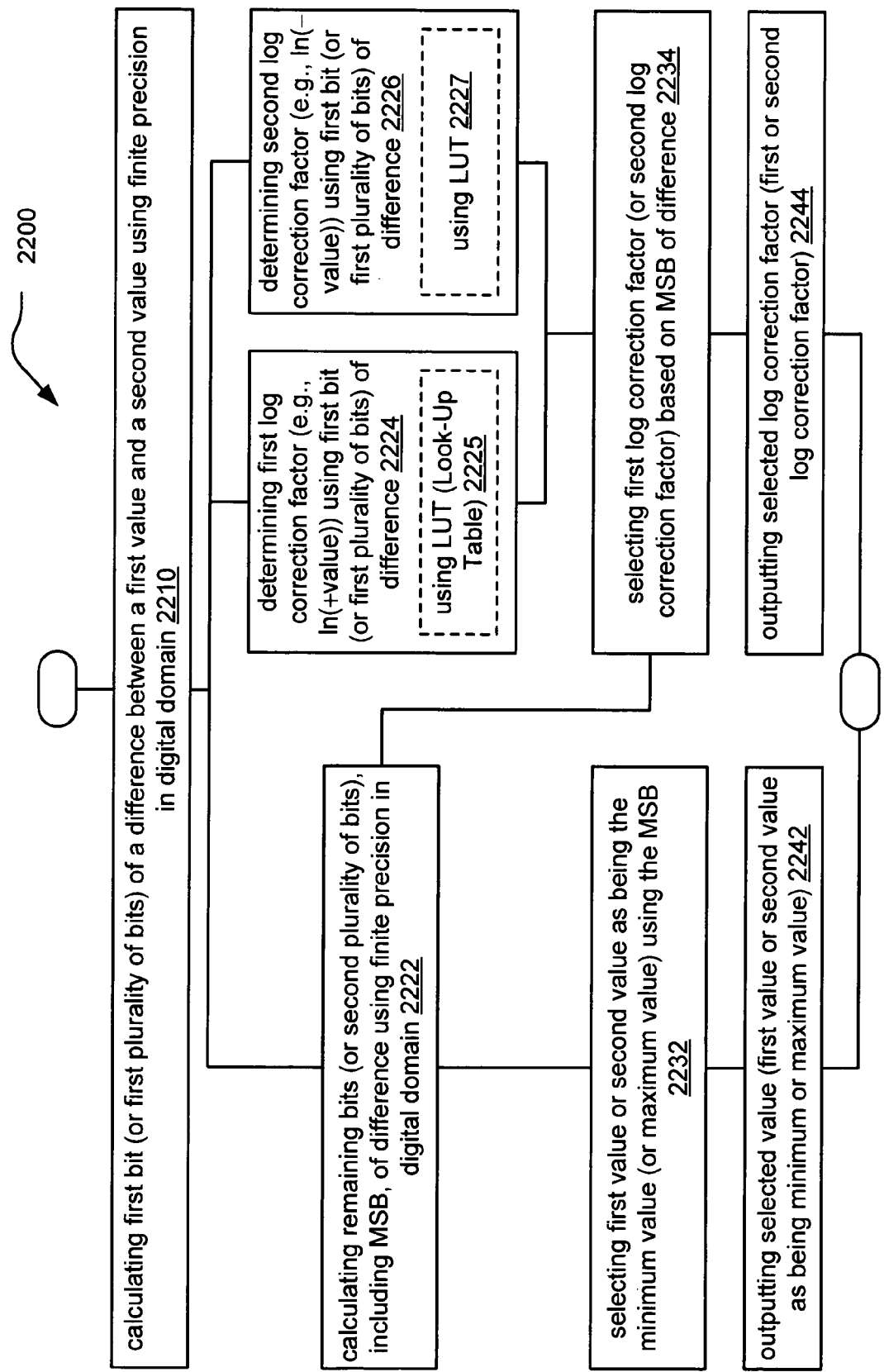

FIG. 22 is a flowchart illustrating an embodiment of alternative method for performing min*− (or max*)− processing in accordance with certain aspects of the invention.

DETAILED DESCRIPTION OF THE INVENTION

Various aspects of the invention may be found in any number of devices that perform decoding of LDPC (Low Density Parity Check) coded signals. In some instances, the decoding approaches and functionality presented herein are operable to decode and process signals that have been generated and that comply with the DVB-S2 (i.e., DVB-Satellite Version 2) standard. In addition, the decoding approaches and functionality presented herein may also be adapted to decode and process signals that have been generated and that comply with draft standards and recommended practices that have been provided by the IEEE P802.3an (10GBASE-T) Task Force.

Generally speaking, the decoding approaches and functionality presented herein may be found in any number of devices that perform processing of LDPC coded signals and/or other coded signal types. Sometimes, these devices are operable to perform both transmit processing (including encoding) as well as receive processing (including decoding) of LDPC coded signals. In other instances, these devices are operable to perform only receive processing (including decoding) of LDPC coded signals.

The decoding aspects of the invention are adaptable to accommodate decoding of such LDPC signals having variable modulation and/or variable code rate. For example, the DVB-S2 standard explicitly describes the means by which VCM (Variable Coding and Modulation) and ACM (Adaptive Coding and Modulation) may be implemented by generating the various LDPC coded signals employed within the DVB-S2 standard. In general, the code rate and/or modulation of such DVB-S2 compliant signals changes may change on a frame by frame basis. The decoding approaches and functionality presented herein are capable of processing and decoding signals whose code rate and/or modulation may vary as frequently as on a frame by frame basis. Moreover, the decoding approaches and functionality presented herein are also capable of processing and decoding signals whose code rate and/or modulation may vary as frequently as on a block by block basis. For example, a block may be viewed as being a group of symbols within a frame. In some instances, a frame may include multiple blocks.

Still, decoding approaches and functionality presented are also adaptable to accommodate decoding of LDPC signals that have a single code rate and/or single modulation for all of the symbols of the LDPC coded signal. For example, for an LDPC signal whose symbols all have a common code rate and a common modulation (constellation and mapping), any of the LDPC decoding approaches enumerated herein (and described below in more detail) may be employed to decode such an LDPC coded signal.

Figure 1:
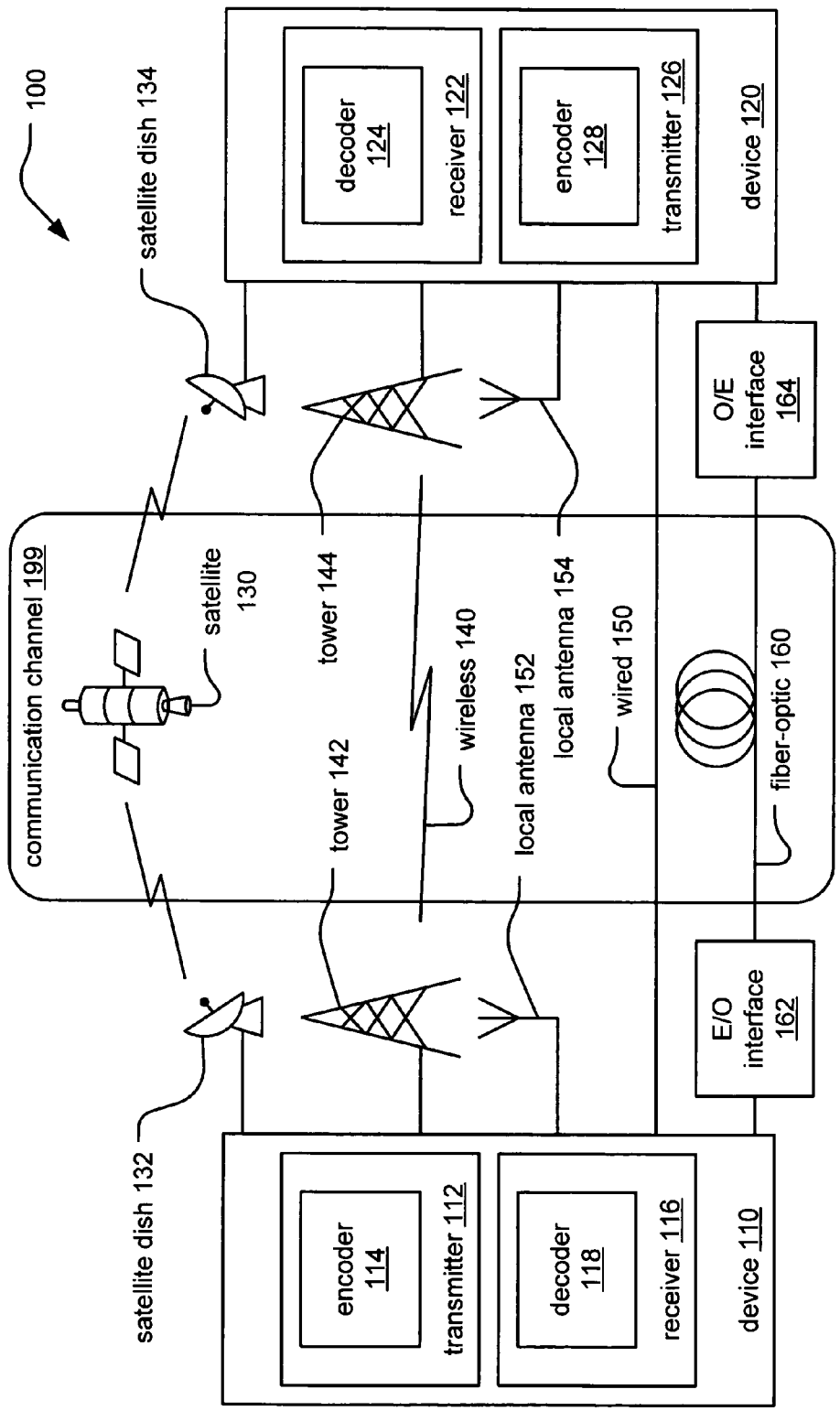
FIG. 1 and FIG. 2 are diagrams illustrating various embodiments of communication systems that may be built in accordance with certain aspects of the invention.
Figure 2:
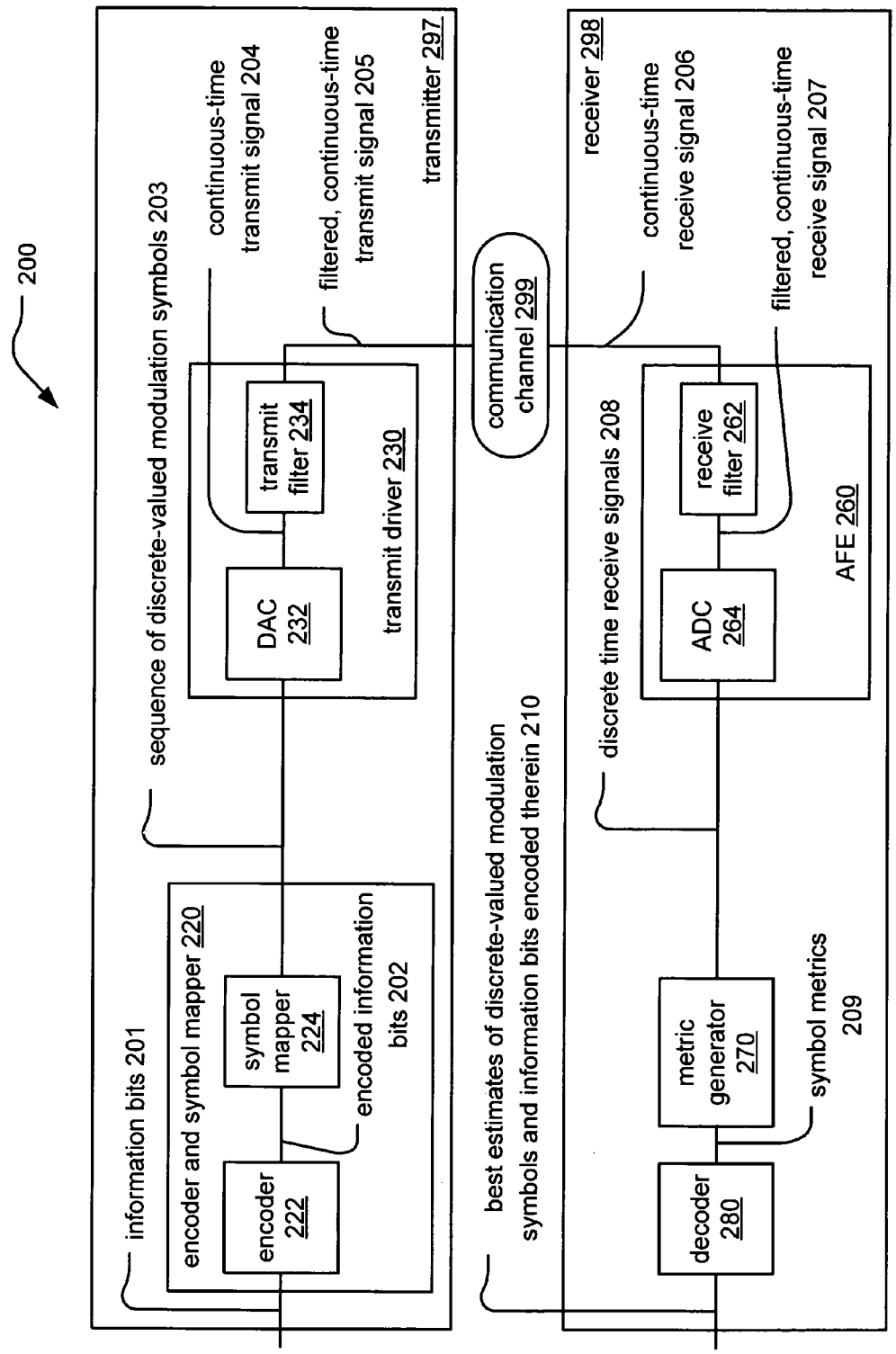

FIG. 1 and FIG. 2 are diagrams illustrating various embodiments of communication systems, 100 and 200, respectively, that may be built in accordance with certain aspects of the invention.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates symbol metrics 209 that are employed by a decoder 280 to make best estimates of the discrete-valued modulation symbols and information bits encoded therein 210.

The decoders of either of the previous embodiments may be implemented to include various aspects of the invention therein. In addition, several of the following Figures describe other and particular embodiments (some in more detail) that may be used to support the devices, systems, functionality and/or methods that may be implemented in accordance with certain aspects of the invention. One particular type of signal that is processed according to certain aspects of the invention is an LDPC coded signal. Before more details are provided below, a general description of LDPC codes is provided.

Figure 3:
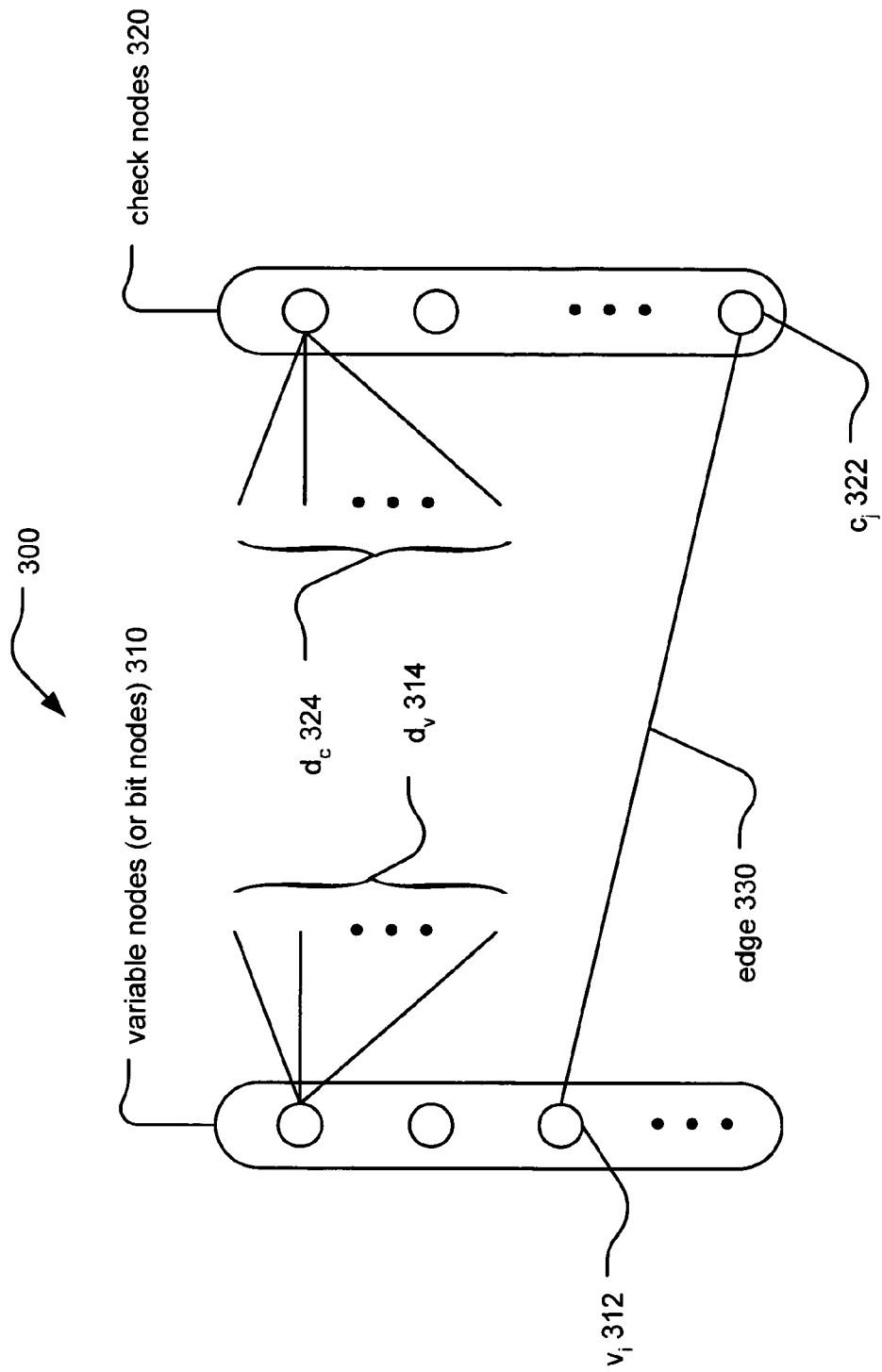
FIG. 3 is a diagram illustrating an embodiment of an LDPC (Low Density Parity Check) code bipartite graph.

FIG. 3 is a diagram illustrating an embodiment of an LDPC (Low Density Parity Check) code bipartite graph 300. In the art, an LDPC bipartite graph may also be referred to as a Tanner graph. An LDPC code may be viewed as being a code having a binary parity check matrix such that nearly all of the elements of the matrix have values of zeros (e.g., the binary parity check matrix is sparse). For example, $H=(h_{i,j})_{M \times N}$ may be viewed as being a parity check matrix of an LDPC code with block length N.

The number of 1's in the i-th column of the parity check matrix may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v,d_c)$ regular LDPC code, otherwise the LDPC code is called an irregular LDPC code.

LDPC codes were introduced by R. Gallager in [1] referenced below and by M. Luby et al. in [2] also referenced below.

[1] R. Gallager, *Low-Density Parity-Check Codes*, Cambridge, Mass.: MIT Press, 1963.

[2] M. Luby, M. Mitzenmacher, A. Shokrollahi, D. Spielman, and V. Stemann, "Practical loss-resilient codes," 1997.

A regular LDPC code can be represented as a bipartite graph 300 by its parity check matrix with left side nodes representing variable of the code bits (or alternatively as the "variable nodes" (or "bit nodes") 310 in a bit decoding approach to decoding LDPC coded signals), and the right side nodes representing check equations (or alternatively as the "check nodes" 320). The bipartite graph 300 of the LDPC code defined by H may be defined by N variable nodes (e.g., N bit nodes) and M check nodes. Every variable node of the N variable nodes 310 has exactly $d_v(i)$ edges (an example edge shown using reference numeral 330) connecting the bit node, $v_i$ 312, to one or more of the check nodes (within the M check nodes). The edge 310 is specifically shown as connecting from the bit node, $v_i$ 312, to the check node, $c_j$ 322. This number of $d_v$ edges (shown as $d_v$ 314) may be referred to as the degree of a variable node i. Analogously, every check node of the M check nodes 1520 has exactly $d_c(j)$ edges (shown as $d_c$ 324) connecting this node to one or more of the variable nodes (or bit nodes) 310. This number of edges, $d_c$, may be referred to as the degree of the check node j.

An edge 330 between a variable node $v_i$ (or bit node $b_i$) 312 and check node $c_j$ 322 may be defined by e=(i, j). However, on the other hand, given an edge e=(i, j), the nodes of the edge may alternatively be denoted as by e=(v(e),c(e)) (or e=(b(e),c(e))). Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$). Given a check node $c_j$, one may define the set of edges emitting from the node $c_j$ by $E_c(j)=\{e|c(e)=j\}$. Continuing on, the derivative result will be $|E_v(i)|=d_v$ (or $|E_b(i)|=d_b$) and $|E_c(j)|=d_c$.

Generally speaking, any codes that can be represented by a bipartite graph may be characterized as graph codes. It is also noted that an irregular LDPC code may also described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby et al. in [2] referenced above.

In general, with a graph of an LDPC code, the parameters of an LDPC code can be defined by a degree of distribution, as described within M. Luby et al in [2] referenced above and also within the following reference:

[3] T. J. Richardson and R. L. Urbanke, "The capacity of low-density parity-check code under message-passing decoding," *IEEE Trans. Inform. Theory*, Vol. 47, pp. 599-618, February 2001.

This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda, \rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that certain aspects of the invention are also operable to accommodate both regular LDPC codes and irregular LDPC codes.

The LLR (Log-Likelihood Ratio) decoding approach of LDPC codes may be described generally as follows: the probability that a bit within a received vector in fact has a value of 1 when a 1 was actually transmitted is calculated. Similarly, the probability that a bit within a received vector in fact has a value of 0 when a 0 was actually transmitted is calculated. These probabilities are calculated using the LDPC code's parity check matrix that is used to check the parity of the received vector. The LLR is the logarithm of the ratio of these two calculated probabilities. This LLR gives a measure of the degree to which the communication channel over which a signal is transmitted may undesirably affect the bits within the vector.

The LLR decoding of LDPC codes may be described mathematically as follows:

Beginning with $C=\{v|v=(v_0, \ldots, v_{N-1})vH^T=0\}$ being an LDPC code and viewing a received vector, $y=(y_0, \ldots, y_{N-1})$, within the sent signal having the form of $((-1)^{v_0}, \ldots, (-1)^{v_{N-1}})$, then the metrics of the channel may be defined as $p(y_i|v_i=0)$, $p(y_i|v_i=1)$, $i=0, \ldots, N-1$. The LLR of a metric, $L_{metric}(i)$, will then be defined as follows:

$$L_{metric}(i) = \ln\frac{p(y_i \mid v_i = 0)}{p(y_i \mid v_i = 1)}$$

It is noted than "ln," as depicted herein within various mathematical expressions, refers to the natural logarithm having base e.

For every variable node $v_i$, its LLR information value will then be defined as follows:

$$\ln\frac{p(v_i = 0 \mid y_i)}{p(v_i = 1 \mid y_i)} = L_{metric}(i) + \ln\frac{p(v_i = 0)}{p(v_i = 1)}$$

Since the variable node, $v_i$, is in an LDPC codeword, then the value of the ratio of these values, ln $$\frac{p(v_i = 0)}{p(v_i = 1)},$$

may be replaced by the following $$\ln\frac{p(v_i = 0, vH^T = 0 \mid y)}{p(v_i = 1, vH^T = 0 \mid y)} = \sum_{(i,j) \in E_v(i)} \ln\frac{p(v_i = 0, vh_j^T = 0 \mid y)}{p(v_i = 1, vh_j^T = 0 \mid y)}$$

where $E_v(i)$ is a set of edges starting with $v_i$ as defined above.

When performing the BP (Belief Propagation) decoding approach in this context, then the value of ln $$\frac{p(v_i = 0, vh_j^T = 0 \mid y)}{p(v_i = 1, vh_j^T = 0 \mid y)}$$

may be replaced by the following relationship $$L_{check}(i, j) = \ln\frac{p\left(\sum_{e \in E_c(j)\setminus\{(i,j)\}} v_{v(e)} = 0 \mid y\right)}{p\left(\sum_{e \in E_c(j)\setminus\{(i,j)\}} v_{v(e)} = 1 \mid y\right)}$$

$L_{check}^*(i, j)$ is called the EXT (extrinsic) information of the check node $c_j$ with respect to the edge $(i, j)$. In addition, it is noted that $e \in E_c(j)\setminus\{(i, j)\}$ indicates all of the edges emitting from check node $c_j$ except for the edge that emits from the check node $c_j$ to the variable node $v_i$. Extrinsic information values may be viewed as those values that are calculated to assist in the generation of best estimates of actual info bit values within a received vector. Also in a BP approach, then the extrinsic information of the variable node $v_i$ with respect to the edge $(i, j)$ may be defined as follows:

$$L_{var}(i, j) = L_{metric}(i) + \sum_{(i,k) \in E_v(i)\setminus\{(i,j)\}} L_{check}(i, k).$$

Figure 4:
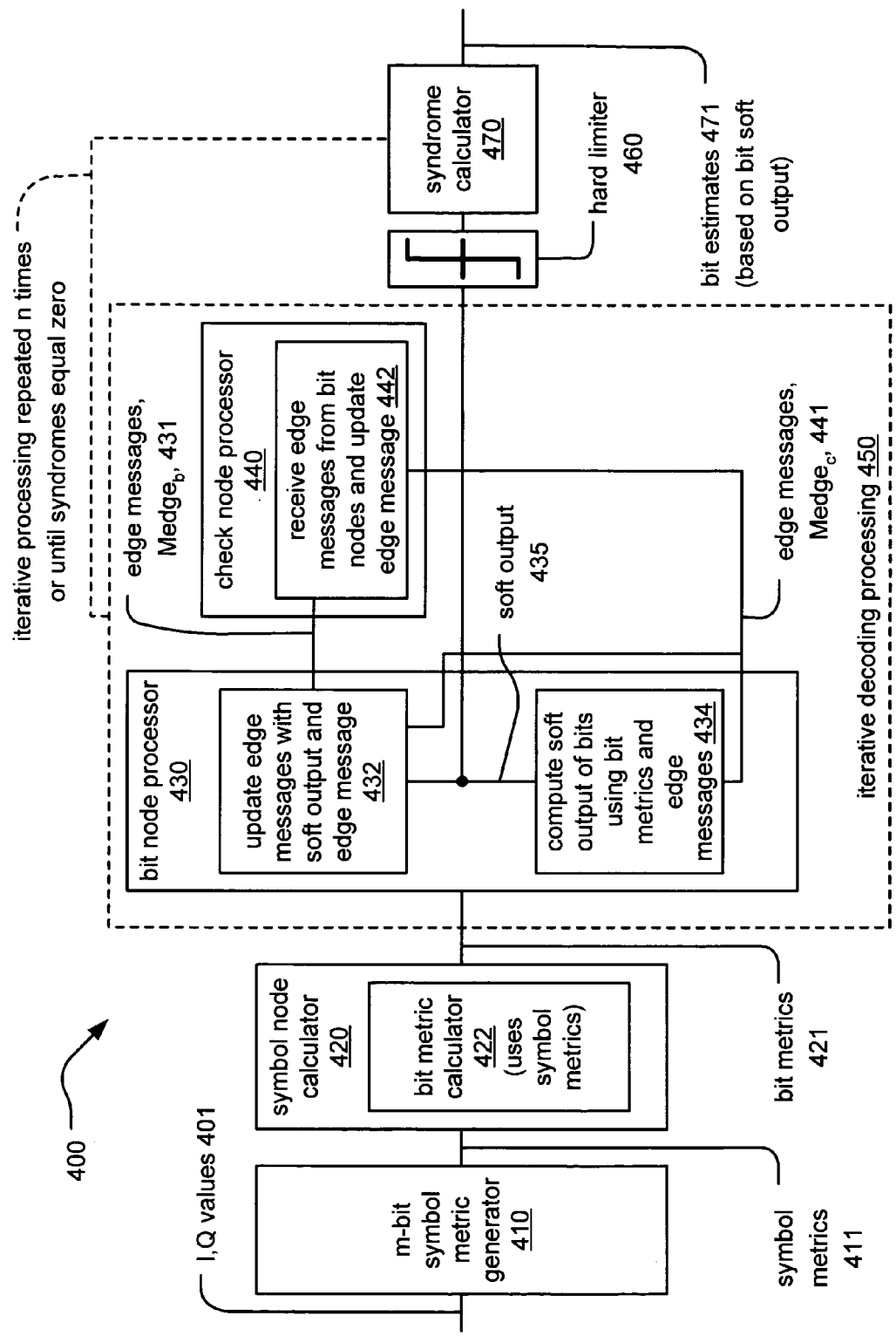
FIG. 4 is a diagram illustrating an embodiment of LDPC (Low Density Parity Check) decoding functionality using bit metric according to certain aspects of the invention.

FIG. 4 is a diagram illustrating an embodiment of LDPC (Low Density Parity Check) decoding functionality using bit metric 400 according to certain aspects of the invention. To perform decoding of an LDPC coded signal having an m-bit signal sequence, the functionality of this diagram may be employed. After receiving the I, Q (In-phase, Quadrature) values 401 of a signal at the symbol nodes, an m-bit symbol metric generator 410 calculates the corresponding symbol metrics 411. At the symbol nodes, these symbol metrics 411 are then passed to a symbol node calculator functional block 420 that uses these received symbol metrics 411 to calculate the bit metrics 421 corresponding to those symbols. These bit metrics 421 are then passed to the bit nodes connected to the symbol nodes according to the LDPC code bipartite graph by which the LDPC coded signal has been generated and by which it is to be decoded.

Thereafter, at the bit nodes, a bit node processor 430 operates to compute the corresponding soft messages of the bits. Then, in accordance with iterative decoding processing 450, the bit node processor 430 receives the edge messages with respect to the check nodes, Medge$_c$ 441, from a check node processor 440 and updates the edge messages with respect to the bit nodes, Medge$_b$ 431, with the bit metrics 421 received from the symbol node calculator functional block 420. These edge messages with respect to the bit nodes, Medge$_b$ 431, after being updated, are then passed to the check node processor 440.

At the check nodes, the check node processor 440 then receives these edge messages with respect to the bit nodes, Medge$_b$ 431, (from the bit node processor 430) and updates the them accordingly thereby generating the next updated version of edge messages with respect to the check nodes, Medge$_c$ 441; this is shown in functional block 442. These updated edge messages with respect to the check nodes, Medge$_c$ 441, are then passed back to the bit nodes (e.g., to the bit node processor 430) where the soft output of the bits is calculated using the bit metrics 421 and the current iteration values of the edge messages with respect to the bit nodes, Medge$_b$ 431; this is shown in functional block 434. Thereafter, using this just calculated soft output of the bits (shown as the soft output 435), the bit node processor 430 updates the edge messages with respect to the bit nodes, Medge$_b$ 431, using the previous values of the edge messages with respect to the bit nodes, Medge$_b$ 431 (from the just previous iteration) and the just calculated soft output 435; this is shown in functional block 432. The iterative decoding processing 450 continues between the bit nodes and the check nodes (i.e., between the bit node processor 450 and the check node processor 440) according to the LDPC code bipartite graph that was employed to encode and generate the signal that is being decoded.

These iterative decoding processing steps, performed by the bit node processor 430 and the check node processor 440, are repeated a predetermined number of iterations (e.g., repeated n times, where n is selectable). Alternatively, these iterative decoding processing steps are repeated until the syndromes of the LDPC code are all equal to zero.

The soft output 435 is generated within the bit node processor 430 during each of the decoding iterations. In this embodiment, this soft output 435 may be provided to a hard limiter 460 where hard decisions may be made, and that hard decision information may be provided to a syndrome calculator 470 to determine whether the syndromes of the LDPC code are all equal to zero. When the syndromes are not equal to zero, the iterative decoding processing 450 continues again by appropriately updating and passing the edge messages between the bit node, processor 430 and the check node processor 440. For example, the edge messages with respect to the bit nodes, Medge$_b$ 431, are passed to the check node processor 440 from the bit node processor 430. Analogously, the edge messages with respect to the check nodes, $Medge_c$ 441, are passed to the bit node processor 430 from the check node processor 440 from. In some embodiments, the soft output 435 and the syndrome calculation performed by the syndrome calculator 470 are both performed during every decoding iteration.

After all of these steps of the iterative decoding processing 450 have been performed, then the best estimates of the bits (shown as bit estimates 471) are output based on the bit soft output. In the approach of this embodiment, the bit metric values that are calculated by the symbol node calculator functional block 420 are fixed values and used repeatedly in updating the bit node values.

Figure 5:
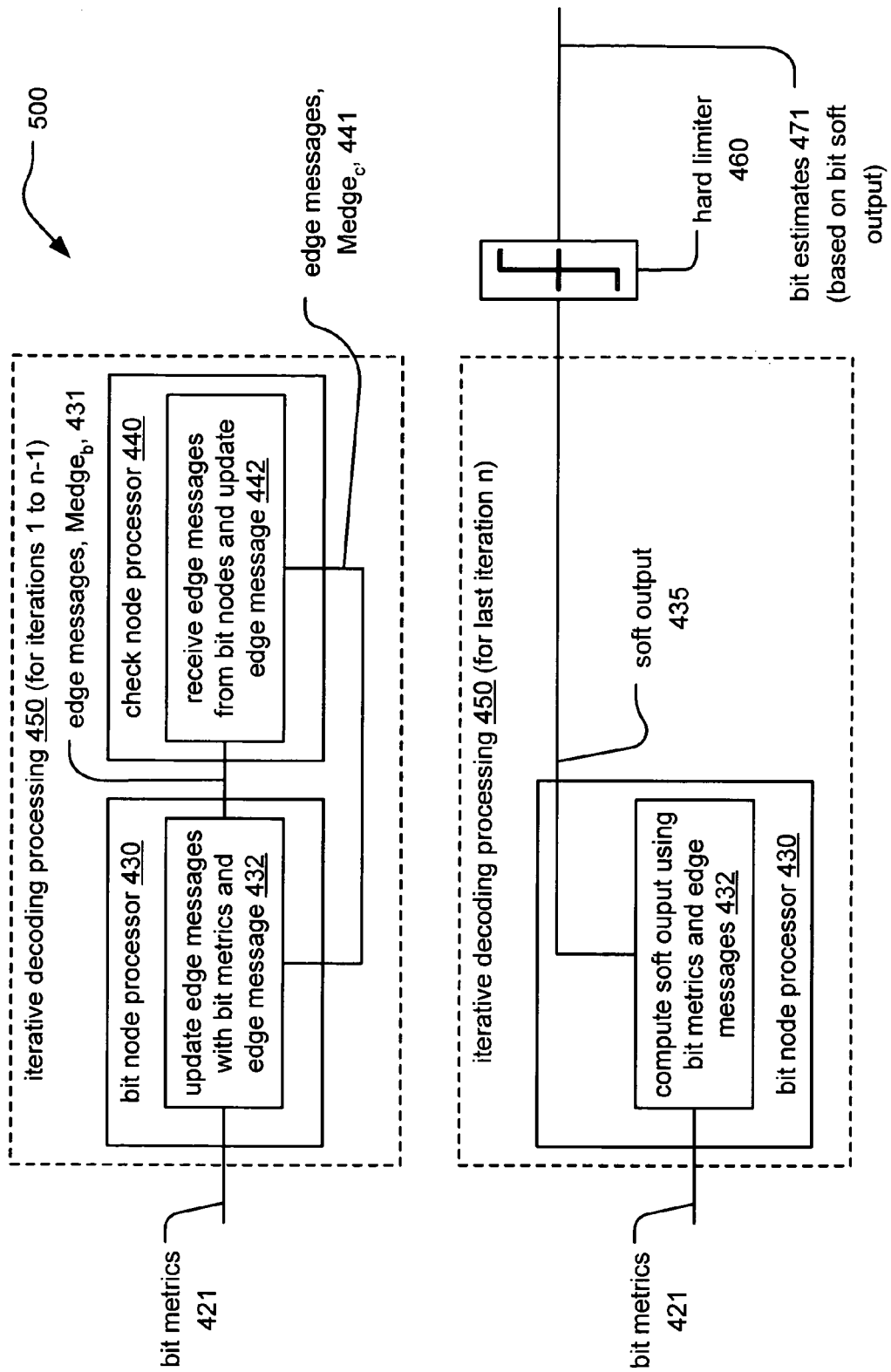
FIG. 5 is a diagram illustrating an alternative embodiment of LDPC decoding functionality using bit metric according to certain aspects of the invention (when performing n number of iterations).

FIG. 5 is a diagram illustrating an alternative embodiment of LDPC decoding functionality using bit metric 500 according to certain aspects of the invention (when performing n number of iterations). This embodiment shows how the iterative decoding processing 450 of the FIG. 4 may be performed when a predetermined number of decoding iterations, shown as n, is performed. If the number of decoding iterations is known beforehand, as in a predetermined number of decoding iterations embodiment, then the bit node processor 430 may perform the updating of its corresponding edge messages with respect to the bit nodes, $Medge_b$ 431, using the bit metrics 421 themselves (and not the soft output 435 as shown in the previous embodiment and described above). This processing may be performed in all but the last decoding iteration (e.g., for iterations 1 through n−1). However, during the last iteration, the bit node processor 430 calculates the soft output 435. The soft output 435 is then provided to the hard limiter 460 where hard decisions may be made of the bits. The syndromes need not be calculated in this embodiment since only a predetermined number of decoding iterations are being performed.

Oftentimes, when implementing LDPC decoding functionality into actual communication devices and hardware, a critical design consideration is how to implement the hardware so that the calculations may be performed as quickly as possible and also with the highest degree of accuracy as possible. Also, hardware implementations of such LDPC decoding functionality can be implemented within the logarithmic domain (or "log domain" for short). In doing this, the hardware implementations can sometimes be simplified, in that, the multiplication processes may be reduced to additions, and the division processes may be reduced to subtractions. Oftentimes, the difficulty in implementing the calculations necessary to perform the LDPC decoding processing lie in the difficult to implement the calculations necessary to perform check node processing. For example, the calculations performed within a check node processor (or bit-check processor that is performing check node processing) often require the determination of a minimum (or maximum) value from among a number of possible values. When these calculations are performed in actual hardware whose calculations are implemented in the log domain, this often involves determining this minimum (or maximum) value at the cost of some precision. That is to say, without employing some log correction factor within the calculations, then a loss of precision may be incurred. Even when implemented in the log domain, some prior art decoding approaches only select a minimum (or maximum) value from among a number of possible values without employing any log correction factor. This inherently introduced some imprecision when selecting a minimum (or maximum) value from among a number of possible values when operating in the log domain.

Several of these calculations are presented below with respect to operating on an input value "x" and an input value "y." These input values may be viewed as being different edge messages with respect to the bit nodes, $Medge_b$. For example, the input value "x" may be viewed as being a first edge message with respect to the bit nodes, $Medge_b(1)$, and the input value "y" may be viewed as being a second edge message with respect to the bit nodes, $Medge_b(2)$, or vice versa. The check node processing of these edge messages with respect to the bit nodes, $Medge_b$, using any of the various possible embodiments presented herein, is employed to generate the corresponding updated edge messages with respect to the check nodes, $Medge_c$.

The inventors have developed a number of means by which these calculations may be performed while still maintaining a high degree of accuracy when performing check node processing. These calculations include min* (min-star) processing, min*− (min-star-minus) processing, min (min-double-star) processing, min− (min-double-star-minus) processing. In addition, each of these processing approaches has a corresponding maximum related function: max* (max-star) processing, max*− (max-star-minus) processing, max (max-double-star) processing, max− (max-double-star-minus) processing. In addition, other processing approaches may be employed including min' (min-prime) processing, min† (min-dagger) processing, min†− (min-dagger-minus) processing, min†† (min-double-dagger) processing. Several of these possible calculations are presented below with respect to operating on an input value "x" and an input value "y."

$$\min{}^* \text{ processing and } \min{}^* -\text{processing:}$$

$$\min{}^*(x, y) = \min(x, y) - \ln(1 + \exp(-|x - y|))$$

$$\min{}^* -(x, y) = \min(x, y) - \ln(1 - \exp(-|x - y|))$$

$$\max{}^* \text{ processing and } \max{}^* -\text{processing:}$$

$$\max{}^*(x, y) = \max(x, y) + \ln(1 + \exp(-|x - y|))$$

$$\max{}^* -(x, y) = \max(x, y) + \ln(1 - \exp(-|x - y|))$$

$$\min{}^{} \text{ processing and } \min{}^{} -\text{processing:}$$

$$\min{}^{**}(x, y) =$$
$$\quad \min(x, y) - \ln(1 + \exp(-|x - y|)) + \ln(1 + \exp(-(x + y)))$$

$$\min{}^{**} -(x, y) =$$
$$\quad \min(x, y) - \ln(1 - \exp(-|x - y|)) + \ln(1 - \exp(-(x + y)))$$

$$\max{}^{} \text{ processing and } \max{}^{} -\text{processing}$$

$$\max{}^{**}(x, y) =$$
$$\quad \max(x, y) + \ln(1 + \exp(-|x - y|)) - \ln(1 + \exp(-(x + y)))$$

$$\max{}^{**} -(x, y) =$$
$$\quad \max(x, y) + \ln(1 - \exp(-|x - y|)) - \ln(1 - \exp(-(x + y)))$$

$$\min{}' \text{ processing:}$$

$$\min{}'(x, y) = \begin{cases} \min{}^*(x, y) & \min{}^*(x, y) > 0 \\ 0 & \text{otherwise} \end{cases}$$

$$\min{}\dagger \text{ processing}$$

$$\min{}\dagger(x, y) = \begin{cases} \min{}^*(x, y) & \min{}^*(x, y) \geq 0 \\ 0 & \text{otherwise} \end{cases}$$

$$\min{}\dagger -\text{processing:}$$

$$\min{}\dagger -(x, y) = \begin{cases} \min{}^* -(x, y) & \min{}^* -(x, y) > 0 \\ 0 & \text{otherwise} \end{cases}$$

The functionality and processing of some of these various types of processing are presented below in conjunction with accompanying diagrams. With respect to the min†† (min-double-dagger) processing, this min†† processing may be viewed as being somewhat analogous to min* processing with the additional functionality of minimum comparison processing. As can be seen below in one possible such embodiment, the minimum comparison processing performed within the min†† processing may be implemented when the values operated on are implemented in sign-magnitude format. This sign-magnitude format makes it a bit easier to find the minimum value from among a plurality of values.

Certain aspects of the invention provide for extremely fast and efficient hardware implementations of these calculations that may be employed when performing check node processing when decoding LDPC coded signals. In addition, various architectures are presented below showing how and where these various calculations are performed within the decoding processing operations.

As mentioned above, there are different possible means by which check node processing functionality may be implemented in accordance with certain aspects of the invention. One possible means is presented below with respect to FIG. 6.

Figure 6:
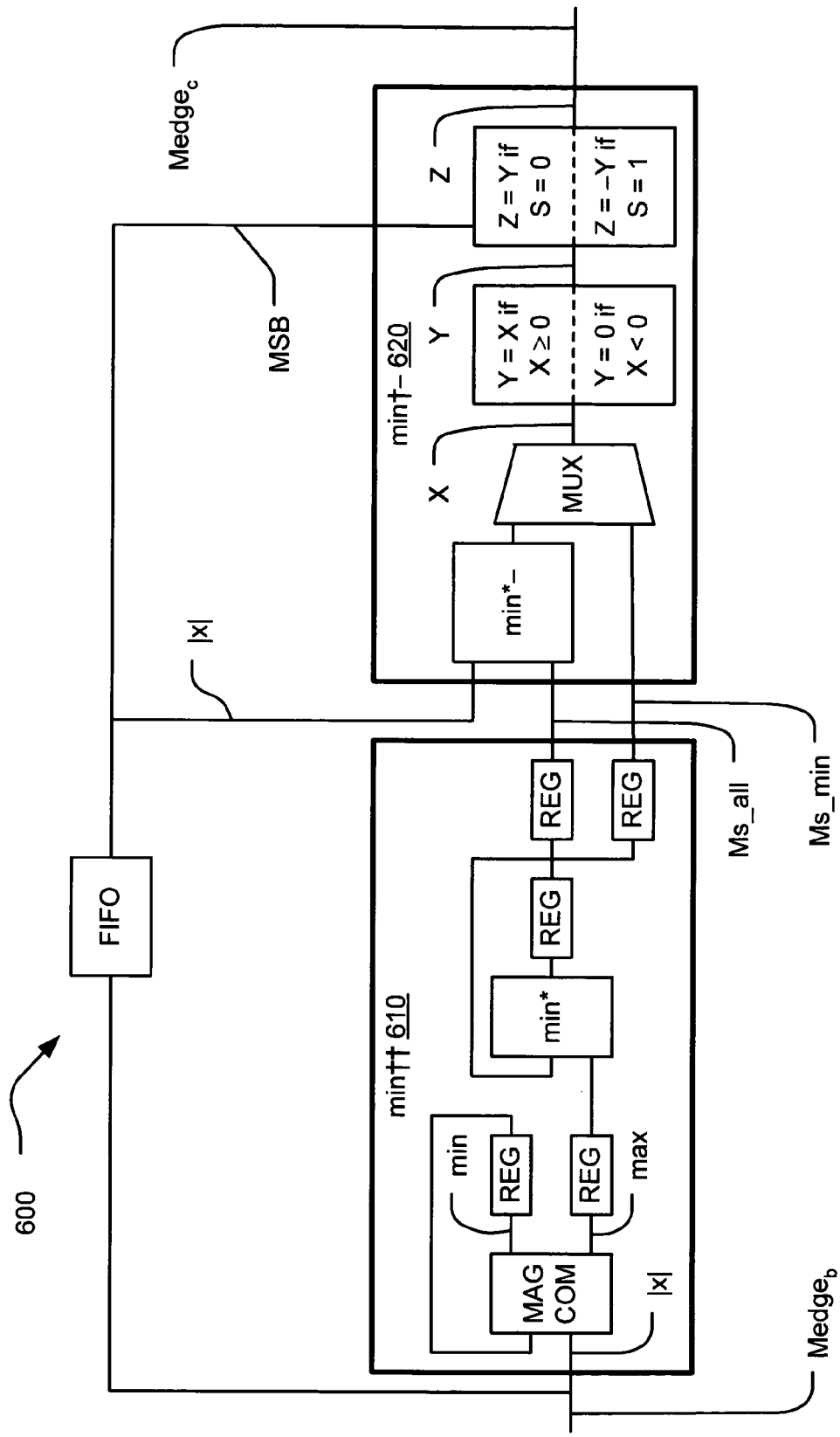
FIG. 6 is a diagram illustrating an embodiment of check node processing functionality according to certain aspects of the invention.

FIG. 6 is a diagram illustrating an embodiment of check node processing functionality 600 according to certain aspects of the invention. This diagram may be viewed as one possible manner by check node processing functionality 2100 can be implemented. This diagram employs a min†† processing functional block 610 and a min†- processing functional block 620 to update the edge messages with respect to the check nodes, Medge$_c$, using the edge messages with respect to the bit nodes, Medge$_b$.

Within the min†† processing functional block 610, the received edge messages with respect to the bit nodes, Medge$_b$, immediately undergo an absolute value determination and a format change to sign magnitude format so that the minimum of all inputs is easier to find. This is performed within a magnitude compare functional block (shown as MAG COM). The minimum (shown as min) and maximum (shown as max) value of all of the edge messages with respect to the bit nodes, Medge$_b$. The maximum value of all of the edge messages with respect to the bit nodes, Medge$_b$, is output from the magnitude compare functional block. This maximum value is passed to a min* processing functional block within the min†† processing functional block 610. The ultimate outputs from the min†† processing functional block 610 is the min* processing resultant of all of the edge messages with respect to the bit nodes, Medge$_b$, (which is shown as Ms_all) and the min* processing resultant of all of the edge messages with respect to the bit nodes, Medge$_b$, except for the minimum input value (which is shown as Ms_min).

The min†- processing functional block 620 receives each of these min* processing resultants (Ms_all and Ms_min). The min†- processing functional block 620 also receives the absolute value of x, namely |x|, from the FIFO. A min*- processing functional block, within the min†- processing functional block 620, operates on the received absolute value of x, namely |x|, and the min* processing resultant of all of the edge messages with respect to the bit nodes, Medge$_b$, (which is shown as Ms_all) that is provided from the min†† processing functional block 610. This resultant, from the min*- processing functional block within the min†- processing functional block 620 is provided as one input to a MUX within the min†- processing functional block 620, and the min* processing resultant of all of the edge messages with respect to the bit nodes, Medge$_b$, except for the minimum input value (which is shown as Ms_min) is provided as the other input to the MUX within the min†- processing functional block 620. The selected output from this MUX is shown as X within the min†- processing functional block 620. Two separate assignments are employed to generate Y and subsequently Z from the value of X.

$$Y = \begin{cases} X & \text{if } X \geq 0 \\ 0 & \text{if } X < 0 \end{cases}$$

$$Z = \begin{cases} Y & \text{if } S = 0 \\ -Y & \text{if } S = 1 \end{cases}$$

S is the MSB (Most Significant Bit) provided from the FIFO. This value of S helps to determine the final value of the updated edge messages with respect to the check nodes, Medge$_c$, based on the convention and assignment of the values Y and Z depicted above.

Each of these various embodiments to perform check node processing and to implement check node processing functionality may be implemented within any embodiment of a communication device that includes LDPC decoding functionality that is operable to decode LDPC coded signals.

The following embodiments show several possible, very efficient means by which the calculations used to perform check node processing may be implemented. several embodiments are illustrated showing min* processing, and these designs can easily be adapted to perform max* processing with very little modification. This minor modification is to comport the hardware to perform the necessary calculations of the desired type of processing. Many of the several types of processing that may be employed when doing check node processing are provided above. For example, the various embodiments of min* processing may easily be adapted to perform max* processing. Analogously, the various embodiments of min*- processing may easily be adapted to perform max*- processing as well.

Figure 7:
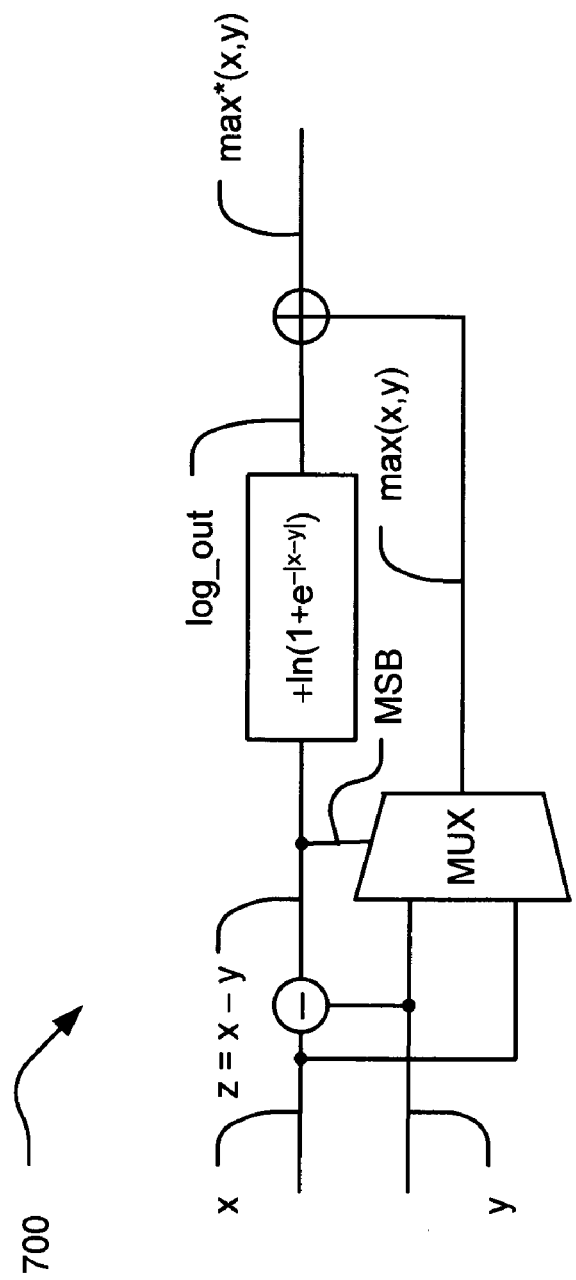
FIG. 7 is a diagram illustrating an embodiment of max* (max-star) processing functionality according to certain aspects of the invention.

FIG. 7 is a diagram illustrating an embodiment of max* (max-star) processing functionality 700 according to certain aspects of the invention. This diagram shows the max* processing operations being performed on two inputs, namely x and y. A difference, z, between x and y is determined (i.e., z=x-y). Each of the inputs, x and y, is also provided to a MUX. The MSB of the difference between x and y, namely z, is used to select which of the inputs, x or y, is the maximum value (i.e., max(x,y)).

Also, the determined difference between x and y, namely z, is provided to a log correction factor calculation functional block that calculates $+\ln(1+e^{-|x-y|})$; this log correction value is shown as log_out. The final max* processing resultant is shown as being the sum of the maximum value of x or y and the log correction value (i.e., log_out).

Figure 8:
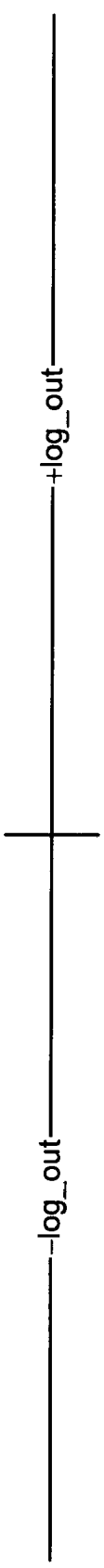
FIG. 8 is a diagram illustrating an embodiment of a max* log table according to certain aspects of the invention.

FIG. 8 is a diagram illustrating an embodiment of a max* log table according to certain aspects of the invention. As mentioned above in other embodiments, a LUT (Look-Up Table) may be employed to provide the predetermined (or pre-calculated) values of the very quickly based on the value of z, which the difference between the two input values. This table provides the values for the log correction factor, log_out (in binary), based on various values of the difference between x and y, namely z. The actual values of the term $+\ln(1+e^{-|x-y|})$ are provided as well as binary assignments of that term (as shown by log_out). As can be seen, when the difference between x and y, namely z, is relatively large beyond a particular threshold (i.e., a relatively large positively valued number) or relatively small beyond a particular threshold (i.e., a relatively large negatively valued number), then the value of log_out is saturated and set to 000. This embodiment of the max* log table shows 3 bits of precision of the log_out value in binary, yet other degrees of precision may alternatively be employed without departing from the scope and spirit of the invention. There is a region of interest of log_out in which its value does change as a function of z. For example, as z varies from approximately +1.25 to −1.25, the value of log_out in fact changes as a function of z. However, when z is greater than +1.25, then the value of log_out is saturated. Also, when z is less than −1.25, then the value of log_out is also saturated.

Because of this behavior of the log correction value, even more efficient and fast implementations of max* processing for use in check node processing in accordance with certain aspects of the invention. Analogously, other calculations employed within check node processing may also benefit from the fact that various values may be predetermined (or pre-calculated) and stored in LUTs, implemented using some type of memory, to provide for even faster calculations and processing within a communication device that employs LDPC decoding functionality in accordance with certain aspects of the invention.

Figure 9:
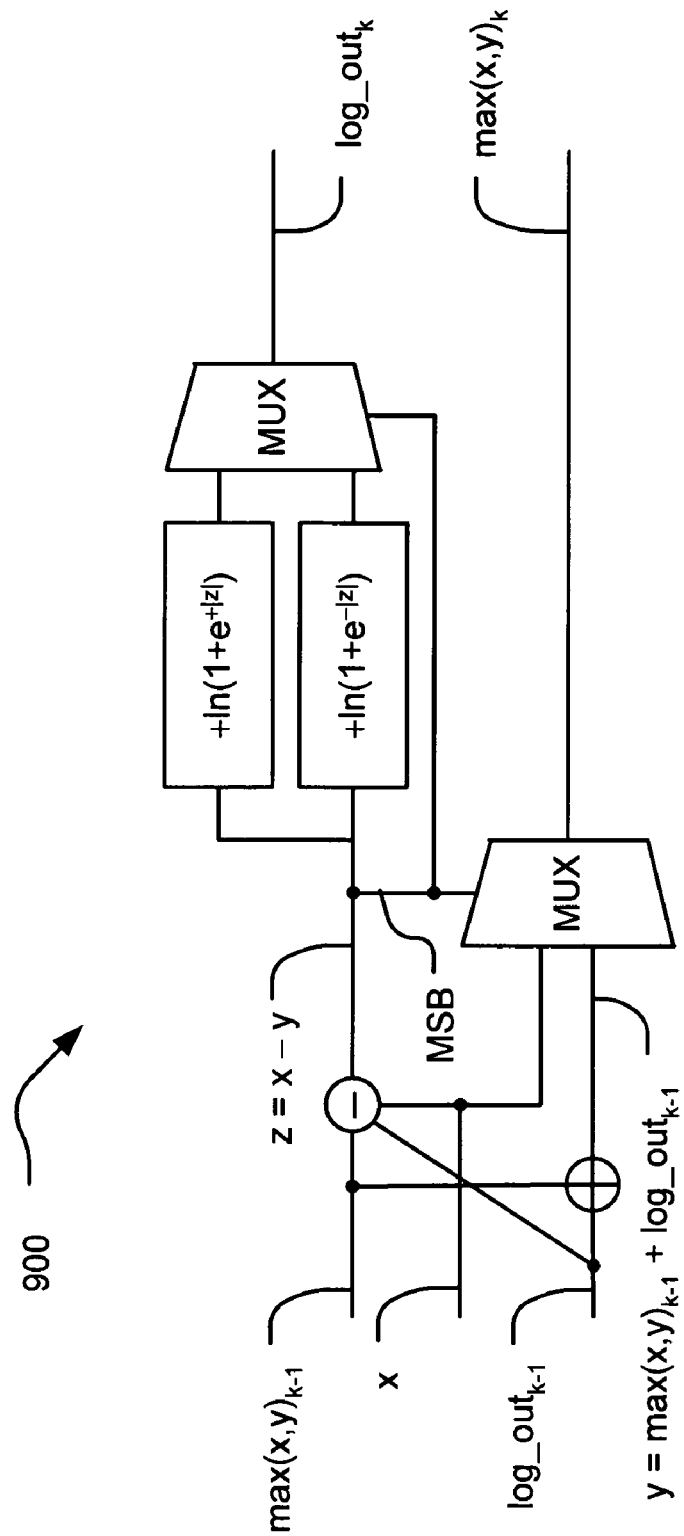
FIG. 9 is a diagram illustrating an alternative embodiment of max* processing functionality according to certain aspects of the invention.

FIG. 9 is a diagram illustrating an alternative embodiment of max* processing functionality 900 according to certain aspects of the invention. The functionality of this diagram is also operable to perform max* processing, but in a much faster manner than the previous embodiment. In some respects, this embodiment has similarity to the embodiment described above. However, this diagram employs two separate and simultaneously operating log correction factor calculation functional blocks.

This diagram also shows the max* processing operations being performed on two inputs, namely x and y. A difference between x and y is determined (i.e., z=x−y). Each of the inputs, x and y, is also provided to a MUX. The value of y is the sum of two other values, namely the maximum value of x or y from a previous iteration (shown as $\max(x,y)_{k-1}$) and the log correction factor from the previous iteration (shown as $\log\_out_{k-1}$). The MSB of the difference between x and y, namely z, is used to select which of the inputs, x or y, is the maximum value in this iteration (i.e., $\max(x,y)_k$).

Also, the determined difference between x and y, namely z, is provided to the two separate log correction factor calculation functional blocks that calculate $+\ln(1+e^{-|z|})$ and $+\ln(1+e^{+|z|})$, respectively, in accordance with max* processing. Each of the resultant values from these two separate log correction factor calculation functional blocks is provided to another MUX. The same MSB of the difference between x and y, namely z, is used to select which of these values from the two separate log correction factor calculation functional blocks is to be used as the actual log correction value in this iteration. The final selected log correction value in this iteration is shown as $\log\_out_k$. The final max* processing resultant may be viewed as being the sum of the maximum value of x or y (i.e., $\max(x,y)_k$) and the log correction value (i.e., $\log\_out_k$). However, in this embodiment, these two values are kept separate for ease of performing subsequent computational steps. If desired, these two values may alternatively be added together.

Figure 10:
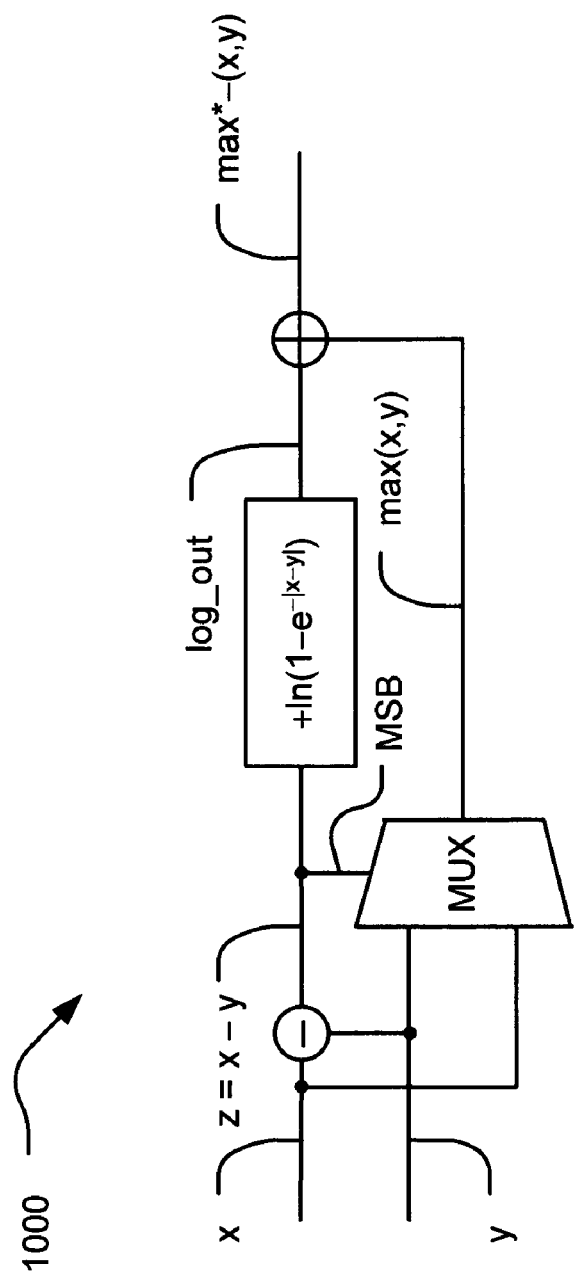
FIG. 10 is a diagram illustrating an embodiment of max*− (max-star-minus) processing functionality according to certain aspects of the invention.

FIG. 10 is a diagram illustrating an embodiment of max*− (max-star-minus) processing functionality 1000 according to certain aspects of the invention. The functionality of this diagram is somewhat similar to the functionality of the min* (min-star) processing functionality 700.

This diagram shows the max*− processing operations being performed on two inputs, namely x and y. A difference between x and y is determined (i.e., z=x−y). Each of the inputs, x and y, is also provided to a MUX. The MSB of the difference between x and y, namely z, is used to select which of the inputs, x or y, is the maximum value (i.e., max(x,y)).

Also, the determined difference between x and y, namely z, is provided to a log correction factor calculation functional block that calculates $+\ln(1-e^{-|x-y|})$; this log correction value is shown as log_out. The final max*− processing resultant is shown as being the sum of the maximum value of x or y and the log correction value (i.e., log_out).

FIG. 11 is a diagram illustrating an embodiment of a max*− log table according to certain aspects of the invention. Again, as mentioned above in other embodiments, a LUT (Look-Up Table) may be employed to provide the predetermined (or pre-calculated) values of the very quickly based on the value of z, which the difference between the two input values. This table provides the values for the log correction factor, log_out (in binary), based on various values of the difference between x and y, namely z. The actual values of the term $+\ln(1-e^{-|x-y|})$ are provided as well as binary assignments of that term (as shown by log_out). As can be seen, when the difference between x and y, namely z, is relatively large beyond a particular threshold (i.e., a relatively large positively valued number) or relatively small beyond a particular threshold (i.e., a relatively large negatively valued number), then the value of log_out is saturated and set to 00000. This embodiment of the max*− log table shows 5 bits of precision of the log_out value in binary, yet other degrees of precision may alternatively be employed without departing from the scope and spirit of the invention. There is a region of interest of log_out in which its value does change as a function of z. For example, as z varies from approximately +1.5 to −1.5, the value of log_out in fact changes as a function of z. However, when z is greater than +1.5, then the value of log_out is saturated. Also, when z is less than −1.5, then the value of log_out is also saturated.

With respect to the value of log_out within max*− processing when z=0, then a predetermined value of log_out is employed (shown as 11000 in binary, and identified with an asterisk, *). This is because of the illegal value that would occur if the natural log is taken of a 0 valued number (i.e., ln(0)). Because of this, a predetermined large values estimate is employed for this case as can be seen in the max*− log table.

Because of this behavior of the log correction value, even more efficient and fast implementations of max*− processing for use in check node processing in accordance with certain aspects of the invention. Analogously, other calculations employed within check node processing may also benefit from the fact that various values may be predetermined (or pre-calculated) and stored in LUTs, implemented using some type of memory, to provide for even faster calculations and processing within a communication device that employs LDPC decoding functionality in accordance with certain aspects of the invention.

Figure 12:
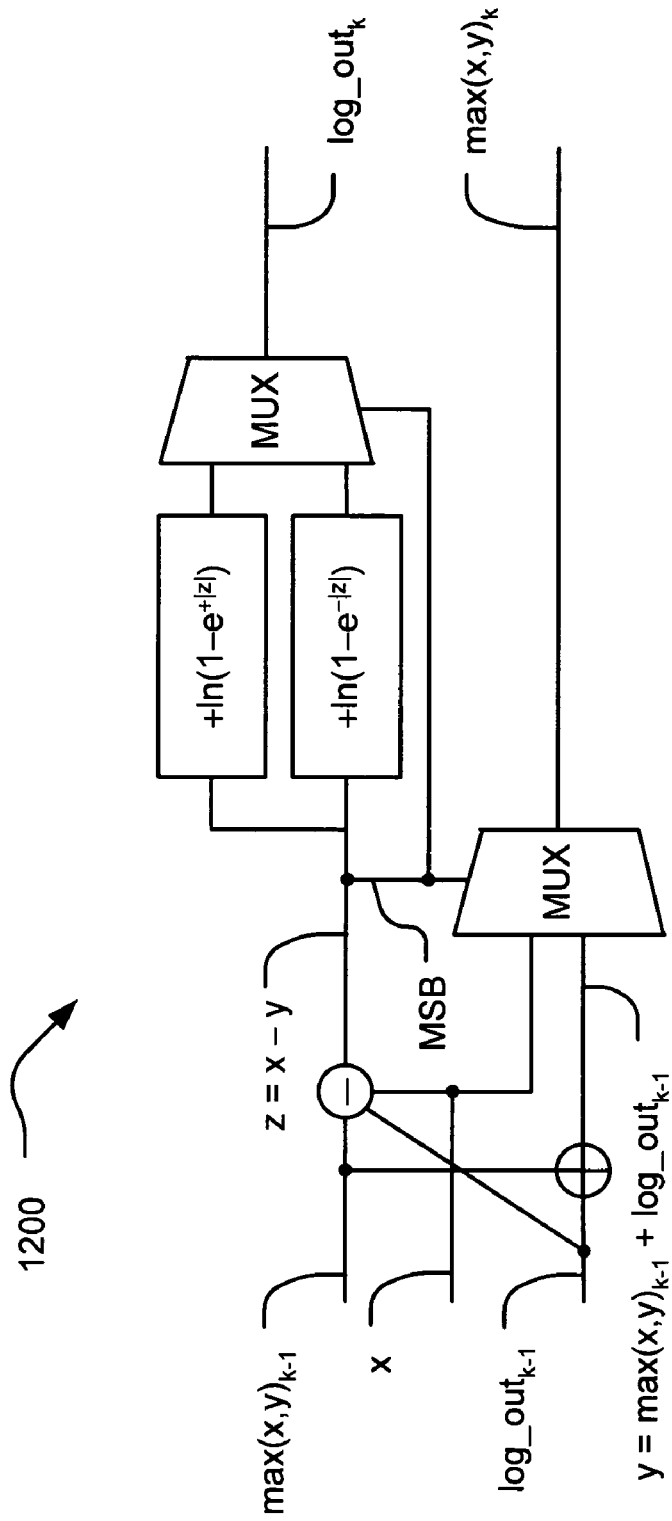
FIG. 12 and FIG. 13 are diagrams illustrating alternative embodiments of max*− processing functionality according to certain aspects of the invention.
Figure 13:
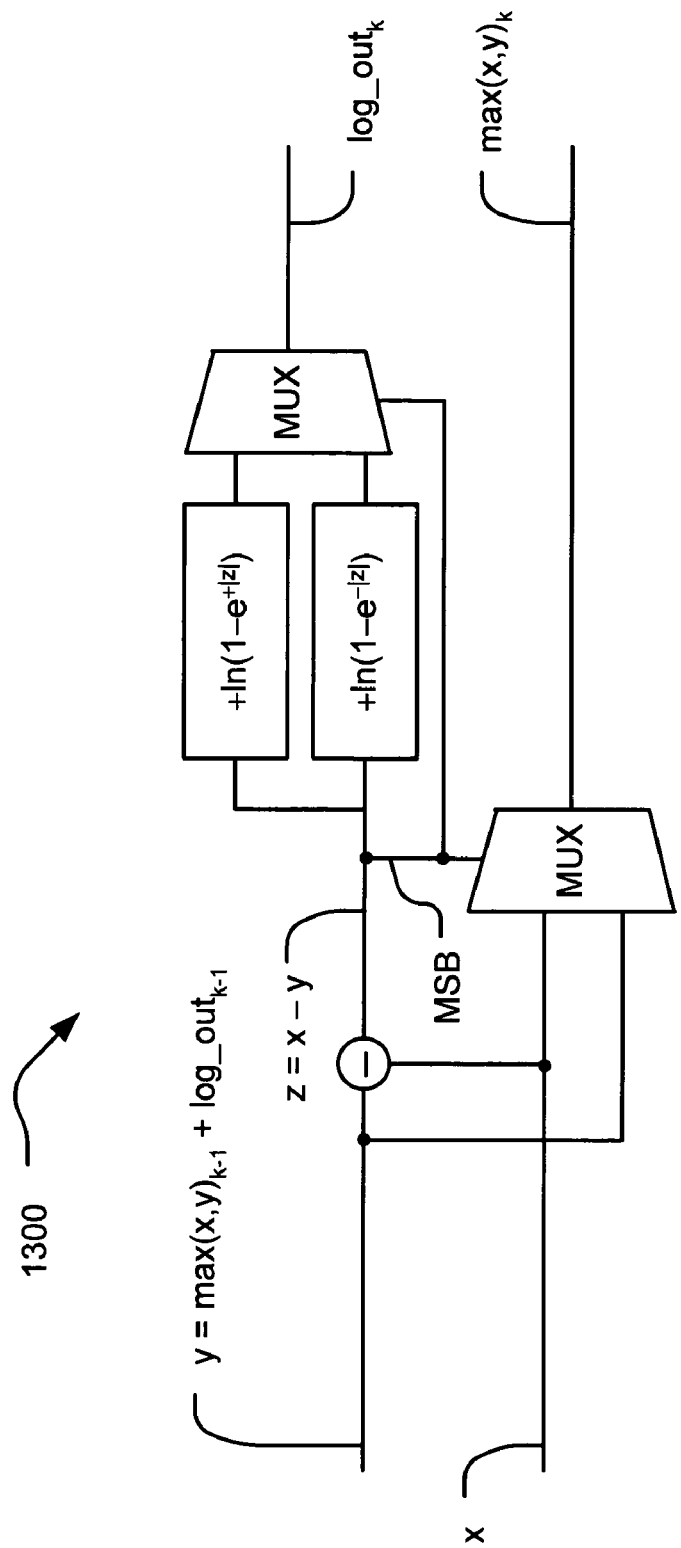

FIG. 12 and FIG. 13 are diagrams illustrating alternative embodiments of max*− processing functionality according to certain aspects of the invention.

Referring to the embodiment of max*− processing functionality 1200, this embodiment is somewhat similar to the embodiment of max* processing functionality 900. The functionality of this diagram is also operable to perform max*− processing, but in a much faster manner than the previous embodiment. In some respects, this embodiment has similarity to the embodiment described above that performs max*– processing. However, this diagram employs two separate and simultaneously operating log correction factor calculation functional blocks.

This diagram also shows the max*– processing operations being performed on two inputs, namely x and y. A difference between x and y is determined (i.e., z=x–y). Each of the inputs, x and y, is also provided to a MUX. The value of y is the sum of two other values, namely the maximum value of x or y from a previous iteration (shown as $\max(x,y)_{k-1}$) and the log correction factor from the previous iteration (shown as $\log\_out_{k-1}$). The MSB of the difference between x and y, namely z, is used to select which of the inputs, x or y, is the maximum value in this iteration (i.e., $\max(x,y)_k$).

Also, the determined difference between x and y, namely z, is provided to the two separate log correction factor calculation functional blocks that calculate $+\ln(1-e^{-|z|})$ and $+\ln(1-e^{+|z|})$, respectively, in accordance with max*– processing. Each of the resultant values from these two separate log correction factor calculation functional blocks is provided to another MUX. The same MSB of the difference between x and y, namely z, is used to select which of these values from the two separate log correction factor calculation functional blocks is to be used as the actual log correction value in this iteration. The final selected log correction value in this iteration is shown as $\log\_out_k$. The final max*– processing resultant may be viewed as being the sum of the maximum value of x or y (i.e., $\max(x,y)_k$) and the log correction value (i.e., $\log\_out_k$). However, in this embodiment, these two values are kept separate for ease of performing subsequent computational steps. If desired, these two values may alternatively be added together.

Referring to the embodiment of max*– processing functionality 1300, this embodiment is very similar to the embodiment of max*– processing functionality 1200 with the exception that the values of x and y are received such that y is the combined term of the sum of the maximum value of x or y from a previous iteration (shown as $\max(x,y)_{k-1}$) and the log correction factor from the previous iteration (shown as $\log\_out_{k-1}$); that is to say, y is received as being in the form $y=\max(x,y)_{k-1}+\log\_out_{k-1}$.

The bit degree precision of each of the various embodiments depicted and described herein may be adapted and selected by a designer. While certain examples of bit degree precision have been provided, it is clear that other values of bit degree precision may alternatively be employed without departing from the scope and spirit of the invention.

FIG. 14, FIG. 15, and FIG. 16 are diagrams illustrating various alternative embodiments of min– processing functionality according to certain aspects of the invention.

Referring to FIG. 14, this embodiment 1400 shows one possible implementation of hardware that may be employed to perform min*– processing. This embodiment operates on two inputs, shown as X and Y. These two input values, X and Y, are provided to a decision and comparison block that determines which of these two input values, X and Y, in the smaller, as shown in a block 1420. If X≧Y is not true, then the value of X is selected as the minimum value of X or Y (i.e., min(X,Y)=X). Alternatively, if X≧Y is in fact true, then the value of Y is selected as the minimum value of X or Y (i.e., min(X,Y)=Y). The appropriately selected minimum value is selected from a MUX 1440.

The difference between these two input values, X and Y, is also calculated (i.e., Z=X–Y, and the absolute value calculation of Z is performed as shown in a block 4130 to generate |Z|. Thereafter, the log correction factor, $\ln(1-e^{-|z|})$, is calculated using |Z| as shown in a block 1450. The min*– resultant is shown as being the difference between the minimum value of X or Y (i.e., min(X,Y)) and the log correction factor, $\ln(1-e^{-|Z|})$.

Referring to FIG. 15, this diagram illustrates an embodiment 1500 of a min*– circuit (or min*– processing functional block) that performs the operation of a min*– operator in accordance with certain aspects of the invention. This diagram also may be viewed as being a more detailed depiction and an actual way in which the min*– processing of the preceding diagram may be performed. The min*– processing is shown as operating on two separate inputs, X and Y. In the domain of actual hardware that is implemented to perform digital signal processing, the finite precision of these inputs, X and Y, may be selected as being 6 bits wide.

The use of 6 bit precision is shown in this embodiment for the resultant values of the first input value, X, and the second input value, Y. The resultant values of the first input value, X, and the second input value, Y, are provided to a first MUX (which may be referred to as an input value selection MUX 1520) whose selection is provided by the MSB (Most Significant Bit) of the difference between the first input value, X, and the second input value, Y, is depicted simply as Z[MSB]. This difference, Z, (i.e., with respect to Z=X–Y) may be viewed as being calculated using a subtraction block or subtractor 1510. This MSB of the difference between the first input value, X, and the second input value, Y, is the sign bit of the difference between the two input values. Depending on whether the sign bit (i.e., Z[MSB]) is positive or negative indicates which of the first input value, X, and the second input value, Y, is larger or smaller.

However, before this sign bit, Z[MSB], of the difference between the two input values is available, a number of other calculations are being performed simultaneously and in parallel. For example, the initial calculation of a first plurality of LSBs (Least Significant Bits) of Z 1512 (i.e., first plurality of LSBs of the difference) between the two input values is being made. The actual numbers of this first plurality of LSBs of Z 1512 may be selected based on a designer preference. The total number of bits of the difference, Z, (i.e., Z=X–Y) may be viewed as including bits between an LSB . . . and an MSB. The number of bits within the first plurality of bits may include bits varying between the LSB and a bit n.

Once this first plurality of LSBs of Z 1512, is available, these values are provided to two separate functional blocks that determine a positive log correction factor and a negative log correction factor, respectively. The positive log correction factor is $-\ln(1-\exp(-|X-Y|))$ or ln(+value), and the negative log correction factor is $-\ln(1-\exp(-|Y-X|))$ or ln(–value). In this embodiment, such values are then added to the minimum value of the inputs X or Y.

Alternatively, these values may be implemented such that a positive log correction factor is $+\ln(1-\exp(-|X-Y|))$ or ln(+value), and such that a negative log correction factor is $+\ln(1-\exp(-|Y-X|))$ or ln(–value), and such values are then subtracted from the minimum value of the inputs X or Y.

These two log correction factors may also be viewed as being a first log correction factor and a second log correction factor. The determination of the first log correction factor and the second log correction factor may be determined using predetermined values looked-up from a LUT in some embodiments. Regardless of the manner in which the first log correction factor and the second log correction factor are determined (e.g., either by actual calculation or by using the first plurality of LSBs of the Z 1512 to select particular values from among possible predetermined values within a LUT), these determined values for the first log correction factor and the second log correction factor are provided to a second MUX (which may be referred to a log correction factor MUX 1530).

During this time in which the determination of the first log correction factor and the second log correction factor are being made, the calculation of the difference, Z, between the first input value, X, and the second input value, Y, continues to be made. For example, several of the remaining bits of precision of the difference, Z, to be made and are provided to a min*– forcing circuit 1540. This min*– forcing circuit 1540 uses a second plurality of LSBs of the Z 1514 to force the appropriate value of the log correction factor, if necessary. As mentioned above, the total number of bits of the difference, Z, (i.e., Z=X–Y) may be viewed as including bits between an LSB and an MSB. The number of bits within the first plurality of bits may include bits varying between the LSB and a bit n, and the number of bits within the second plurality of bits may include bits varying between a bit n+1 and the MSB. The min*– forcing circuit 1540 operates by forcing the log correction factor, logout, to a value of 0 if the Z[MSB] (i.e., the MSB of the difference, Z) is equal to 0 and each of the bits of the second plurality of LSBs of the Z 1514 are not all 0s AND the Z[MSB] (i.e., the MSB of the difference, Z) is equal to 1 and each of the bits of the second plurality of LSBs of the Z 1514 are not all 1s. That is to say, the logic AND function of a first input (Z[MSB] is equal to 0 and each of the bits of the second plurality of LSBs of the Z 1514 are not all 0s) and a second input (the Z[MSB] is equal to 1 and each of the bits of the second plurality of LSBs of the Z 1514 are not all 1s).

It is noted that the final and actual log correction factor, $-\ln(1-\exp(-|Z|))$, and the minimum value of X or Y are available at substantially the same time from the min*– circuit of this diagram. If desired, these two values (min(X, Y) and $-\ln(1-\exp(-|Z|))$) may be kept separate in an actual hardware implementation. However, they may also be combined, along with a predetermined offset value if desired in some embodiments, to generate the final min*– resultant. For example, the final log correction factor, $-\ln(1-\exp(-|Z|))$, may be combined with the minimum value of X,Y.

Without any predetermined offset value, the final min*– resultant would appear as follows:

$$\min{}^*-(X,Y)=\min(X,Y)-\ln(1-\exp(-|X-Y|))$$

If desired, this min*– resultant may also by summed with a predetermined offset value to generate a final min*– resultant employed within the calculations of an actual hardware device that performs decoding of coded signals. In some embodiments, the predetermined offset value has a value of 0.5. In such instances, the final min*– resultant would appear as follows:

$$\min{}^*-(X,Y)=\min(X,Y)-\ln(1-\exp(-|X-Y|))+0.5$$

Clearly, any other appropriately selected predetermined offset value may alternatively be selected, as desired, without departing from the scope and spirit of the invention.

Moreover, LUTs may also be used to determine many of these intermediate values as well in an effort to achieve even faster operation. For example, tables may be used to determine the outputs of the min*– log saturation block and the two separate functional blocks that determine the positive log correction factor ($-\ln(1-\exp(-|X-Y|))$ or ln(+value)) and the negative log correction factor ($-\ln(1-\exp(-|Y-X|))$ or ln(–value)), respectively.

By using predetermined values (that are stored in LUTs) for each of these intermediate values, the min*– circuit presented herein can operate very, very quickly. The simultaneous and in parallel determination of many of the intermediate values also operate, at least in part, to support this very fast operation of min*– processing.

Many of the principles that provide for very fast min*– processing may also be applied, after appropriate modification (where necessary), to support very fast max*– processing as well. Several embodiments of performing max*– processing are also provided below.

It is noted that within this embodiment, as well as within any of the other embodiments of this disclosure, the degree of bits is shown for many of the various calculations is shown and described above. However, other degree of bit precision may alternatively be employed without departing from the scope and spirit of the invention. For example, the number of bits employed for each of the various values shown herein may be selected as desired based on a particular design approach.

Referring to FIG. 16, this embodiment 1600 shows a temporal representation of the calculation and determination of various portions of min*– processing. During this min*– processing, simultaneous and parallel processing of bits of Z 1640 (i.e., of the bits of the difference, Z, between two input values, X and Y, where Z=X–Y) is performed in a very fast and efficient manner.

During a $1^{st}$ period of time 1610, a first plurality of LSBs of Z is calculated with respect to the difference, Z, between two input values, X and Y, as shown in a block 1612. As described above with respect to other embodiments, the total number of bits of the difference, Z, (i.e., Z=X–Y) may be viewed as including bits between an LSB and an MSB. The number of bits within the first plurality of bits may include bits varying between the LSB and a bit n, and the number of bits within the second plurality of bits may include bits varying between a bit n+1 and the MSB. This first plurality of LSBs of Z 1612 may be viewed as including the bits varying between the LSB and the bit n.

Thereafter, during a $2^{nd}$ time period 1620, the difference, Z, between two input values, X and Y, continues to be calculated. More specifically, a second plurality of LSBs of Z is calculated with respect to the difference, Z, between the two input values, X and Y, as shown in a block 1622. Also during the $2^{nd}$ time period 1620, the previously calculated first plurality of LSBs of Z is used to determine each of a positive log correction factor is $-\ln(1-\exp(-|X-Y|))$ or ln(+value), and a negative log correction factor is $-\ln(1-\exp(-|Y-X|))$ or ln(–value). In this embodiment, such values may then be added to the minimum value of the inputs X or Y to generate the final min*– resultant. However, these values may also be kept separate for more efficient use in subsequent iterations.

Alternatively, these values may be implemented such that a positive log correction factor is $+\ln(1-\exp(-|X-Y|))$ or ln(+value), and such that a negative log correction factor is $+\ln(1-\exp(-|Y-X|))$ or ln(–value), and such values may then be subtracted from the minimum value of the inputs X or Y. However, these values may also be kept separate for more efficient use in subsequent iterations.

Thereafter, during a $3^{rd}$ time period 1630, the value, Z[MSB], is used to select which of the positive log correction factor is $-\ln(1-\exp(-|X-Y|))$ or ln(+value), and the negative log correction factor is $-\ln(1-\exp(-|Y-X|))$ or ln(–value) is to be used as the actual and final log correction factor. This may be implemented using a MUX whose inputs are the positive log correction factor and the negative log correction factor and whose select signal is the value, Z[MSB]. The output of such a MUX may be viewed as being the actual and final log correction factor, namely, log_out.

In addition, the value, Z[MSB], is used to select which of the inputs, X or Y, is the minimum value. Analogously, this may be implemented using a MUX whose inputs are the values, X and Y, and whose select signal is the value, Z[MSB]. The output of such a MUX may be viewed as being the minimum input value, namely, min(X,Y).

FIG. 17, FIG. 18, and FIG. 19 are diagrams illustrating various alternative embodiments of max*– processing functionality according to certain aspects of the invention.

Referring to FIG. 17, this embodiment 1700 shows one possible implementation of hardware that may be employed to perform max*– processing. This embodiment operates on two inputs, shown as X and Y. These two input values, X and Y, are provided to a decision and comparison block that determines which of these two input values, X and Y, in the larger, as shown in a block 1720. If X≧Y is not true, then the value of Y is selected as the maximum value of X or Y (i.e., max(X,Y)=Y). Alternatively, if X≧Y is in fact true, then the value of X is selected as the maximum value of X or Y (i.e., max(X,Y)=X). The appropriately selected maximum value is selected from a MUX 1740.

The difference between these two input values, X and Y, is also calculated (i.e., Z=X–Y, and the absolute value calculation of Z is performed as shown in a block 1730 to generate |Z|. Thereafter, the log correction factor, $\ln(1-e^{-|Z|})$, is calculated using |Z| as shown in a block 1750. The max*– resultant is shown as being the sum of the maximum value of X or Y (i.e., max(X,Y) 1760) and the log correction factor, $\ln(1-e^{-|Z|})$, shown with respect to reference numeral 1770.

Referring to FIG. 18, this diagram illustrates an embodiment 1800 of a max*– circuit (or max*– processing functional block) that performs the operation of a max*– operator in accordance with certain aspects of the invention. This diagram also may be viewed as being a more detailed depiction and an actual way in which the max*– processing of the preceding diagram may be performed. The max*– processing is shown as operating on two separate inputs, X and Y. In the domain of actual hardware that is implemented to perform digital signal processing, the finite precision of these inputs, X and Y, may be selected as being 6 bits wide.

The use of 6 bit precision is shown in this embodiment for the resultant values of the first input value, X, and the second input value, Y. The resultant values of the first input value, X, and the second input value, Y, are provided to a first MUX (which may be referred to as an input value selection MUX 1820) whose selection is provided by the MSB (Most Significant Bit) of the difference between the first input value, X, and the second input value, Y, is depicted simply as Z[MSB]. This difference, Z, (i.e., with respect to Z=X–Y) may be viewed as being calculated using a subtraction block or subtractor 1810. This MSB of the difference between the first input value, X, and the second input value, Y, is the sign bit of the difference between the two input values. Depending on whether the sign bit (i.e., Z[MSB]) is positive or negative indicates which of the first input value, X, and the second input value, Y, is larger or smaller.

However, before this sign bit, Z[MSB], of the difference between the two input values is available, a number of other calculations are being performed simultaneously and in parallel. For example, the initial calculation of a first plurality of LSBs (Least Significant Bits) of Z 1812 (i.e., first plurality of LSBs of the difference) between the two input values is being made. The actual numbers of this first plurality of LSBs of Z 1812 may be selected based on a designer preference. The total number of bits of the difference, Z, (i.e., Z=X–Y) may be viewed as including bits between an LSB ... and an MSB. The number of bits within the first plurality of bits may include bits varying between the LSB and a bit n.

Once this first plurality of LSBs of Z 1812, is available, these values are provided to two separate functional blocks that determine a positive log correction factor and a negative log correction factor, respectively. The positive log correction factor is ln(1–exp(–|X–Y|) or ln(+value), and the negative log correction factor is ln(1–exp(–|Y–X|) or ln(–value). In this embodiment, such values are then added to the maximum value of the inputs X or Y.

These two log correction factors may also be viewed as being a first log correction factor and a second log correction factor. The determination of the first log correction factor and the second log correction factor may be determined using predetermined values looked-up from a LUT in some embodiments. Regardless of the manner in which the first log correction factor and the second log correction factor are determined (e.g., either by actual calculation or by using the first plurality of LSBs of the Z 1812 to select particular values from among possible predetermined values within a LUT), these determined values for the first log correction factor and the second log correction factor are provided to a second MUX (which may be referred to a log correction factor MUX 1830).

During this time in which the determination of the first log correction factor and the second log correction factor are being made, the calculation of the difference, Z, between the first input value, X, and the second input value, Y, continues to be made. For example, several of the remaining bits of precision of the difference, Z, to be made and are provided to a max*– forcing circuit 1840. This max*– forcing circuit 1840 uses a second plurality of LSBs of the Z 1814 to force the appropriate value of the log correction factor, if necessary. As mentioned above, the total number of bits of the difference, Z, (i.e., Z=X–Y) may be viewed as including bits between an LSB and an MSB. The number of bits within the first plurality of bits may include bits varying between the LSB and a bit n, and the number of bits within the second plurality of bits may include bits varying between a bit n+1 and the MSB. The max*– forcing circuit 1840 operates by forcing the log correction factor, log_out, to a value of 0 if the Z[MSB] (i.e., the MSB of the difference, Z) is equal to 0 and each of the bits of the second plurality of LSBs of the Z 4214 are not all 0s AND the Z[MSB] (i.e., the MSB of the difference, Z) is equal to 1 and each of the bits of the second plurality of LSBs of the Z 4214 are not all 1s. That is to say, the logic AND function of a first input (Z[MSB] is equal to 0 and each of the bits of the second plurality of LSBs of the Z 4214 are not all 0s) and a second input (the Z[MSB] is equal to 1 and each of the bits of the second plurality of LSBs of the Z 4214 are not all 1s).

It is noted that the final and actual log correction factor, ln(1–exp(–|Z|), and the maximum value of X or Y are available at substantially the same time from the max*– circuit of this diagram. If desired, these two values (max(X, Y) and ln(1–exp(–|Z|))) may be kept separate in an actual hardware implementation. However, they may also be combined, along with a predetermined offset value if desired in some embodiments, to generate the final max*– resultant. For example, the final log correction factor, ln(1–exp(–|Z|), may be combined with the maximum value of X, Y.

Without any predetermined offset value, the final max*– resultant would appear as follows:

$$\text{max}^*-(X,Y) = \text{max}(X,Y) + \ln(1-\exp(-|X-Y|))$$

If desired, this max*- resultant may also by summed with a predetermined offset value to generate a final max*- resultant employed within the calculations of an actual hardware device that performs decoding of coded signals. In some embodiments, the predetermined offset value has a value of 0.5. In such instances, the final max*- resultant would appear as follows:

$$\max*-(X,Y) = \max(X,Y) + \ln(1-\exp(-|X-Y|)) + 0.5$$

Clearly, any other appropriately selected predetermined offset value may alternatively be selected, as desired, without departing from the scope and spirit of the invention.

Moreover, LUTs may also be used to determine many of these intermediate values as well in an effort to achieve even faster operation. For example, tables may be used to determine the outputs of the max*- log saturation block and the two separate functional blocks that determine the positive log correction factor ($\ln(1-\exp(-|X-Y|))$ or $\ln(+\text{value})$) and the negative log correction factor ($\ln(1-\exp(-|Y-X|))$ or $\ln(-\text{value})$), respectively.

By using predetermined values (that are stored in LUTs) for each of these intermediate values, the max*- circuit presented herein can operate very, very quickly. The simultaneous and in parallel determination of many of the intermediate values also operate, at least in part, to support this very fast operation of max*- processing.

It is again noted that within this embodiment, as well as within any of the other embodiments of this disclosure, the degree of bits is shown for many of the various calculations is shown and described above. However, other degree of bit precision may alternatively be employed without departing from the scope and spirit of the invention. For example, the number of bits employed for each of the various values shown herein may be selected as desired based on a particular design approach.

Referring to FIG. 19, this embodiment 1900 shows a temporal representation of the calculation and determination of various portions of max*- processing. During this max*- processing, simultaneous and parallel processing of bits of Z 1940 (i.e., of the bits of the difference, Z, between two input values, X and Y, where Z=X-Y) is performed in a very fast and efficient manner.

During a $1^{st}$ period of time 1910, a first plurality of LSBs of Z is calculated with respect to the difference, Z, between two input values, X and Y, as shown in a block 1912. As described above with respect to other embodiments, the total number of bits of the difference, Z, (i.e., Z=X-Y) may be viewed as including bits between an LSB and an MSB. The number of bits within the first plurality of bits may include bits varying between the LSB and a bit n, and the number of bits within the second plurality of bits may include bits varying between a bit n+1 and the MSB. This first plurality of LSBs of Z 1912 may be viewed as including the bits varying between the LSB and the bit n.

Thereafter, during a $2^{nd}$ time period 1920, the difference, Z, between two input values, X and Y, continues to be calculated. More specifically, a second plurality of LSBs of Z is calculated with respect to the difference, Z, between the two input values, X and Y, as shown in a block 1922. Also during the $2^{nd}$ time period 1920, the previously calculated first plurality of LSBs of Z is used to determine each of a positive log correction factor is $\ln(1-\exp(-|X-Y|))$ or $\ln(+\text{value})$, and a negative log correction factor is $\ln(1-\exp(-|Y-X|))$ or $\ln(-\text{value})$. In this embodiment, such values may then be added to the maximum value of the inputs X or Y to generate the final max*- resultant. However, these values may also be kept separate for more efficient use in subsequent iterations.

Thereafter, during a $3^{rd}$ time period 1930, the value, Z[MSB], is used to select which of the positive log correction factor is $\ln(1-\exp(-|X-Y|))$ or $\ln(+\text{value})$, and the negative log correction factor is $\ln(1-\exp(-|Y-X|))$ or $\ln(-\text{value})$ is to be used as the actual and final log correction factor. This may be implemented using a MUX whose inputs are the positive log correction factor and the negative log correction factor and whose select signal is the value, Z[MSB]. The output of such a MUX may be viewed as being the actual and final log correction factor, namely, log_out.

In addition, the value, Z[MSB], is used to select which of the inputs, X or Y, is the maximum value. Analogously, this may be implemented using a MUX whose inputs are the values, X and Y, and whose select signal is the value, Z[MSB]. The output of such a MUX may be viewed as being the maximum input value, namely, max(X,Y).

FIG. 20 is a flowchart illustrating an embodiment of a method 2000 for decoding LDPC coded signals by employing min*- processing or max*- processing in accordance with certain aspects of the invention.

This method involves receiving a continuous time signal (whose information bits have been encoded using LDPC encoding), as shown in a block 2010. This may also involve performing any necessary down-conversion of a first continuous time signal thereby generating a second continuous time signal (may be performed by direct conversion from carrier frequency to baseband or via an IF (Intermediate Frequency)), as shown in a block 2012. That is to say, the originally received continuous time signal may need to undergo certain down-converting and filtering to get it into a baseband signal format.

The method then involves sampling the first (or second) continuous time signal (e.g., using an ADC (Analog to Digital Converter)) thereby generating a discrete time signal and extracting I, Q (In-phase, Quadrature) components there from, as shown in a block 2020. After this, the method then involves demodulating the I, Q components and performing symbol mapping of the I, Q components thereby generating a sequence of discrete-valued modulation symbols, as shown in a block 2030.

The method then involves performing iterative decoding processing according to a preferred LDPC decoding approach. The method then involves performing edge message updating in accordance with LDPC decoding by performing calculations using min*- or max*- processing (for a predetermined number of decoding iterations), as shown in a block 2040.

The method then involves making hard decisions based on soft information corresponding to the most recently updated edge messages with respect to bit nodes, as shown in a block 2050. Ultimately, the method involves outputting a best estimate of a codeword (having information bits) that has been extracted from the received continuous time signal, as shown in a block 2060.

FIG. 21 is a flowchart illustrating an embodiment of an alternative method 2100 for decoding LDPC coded signals by employing min*- processing or max*- processing in accordance with certain aspects of the invention. Initially, this method operates similarly to the embodiment described in the preceding diagram.

For example, this method involves receiving a continuous time signal (whose information bits have been encoded using LDPC encoding), as shown in a block 2110. This may also involve performing any necessary down-conversion of a first continuous time signal thereby generating a second continuous time signal (may be performed by direct conversion from carrier frequency to baseband or via an IF (Intermediate Frequency)), as shown in a block 2112. That is to say, the originally received continuous time signal may need to undergo certain down-converting and filtering to get it into a baseband signal format.

The method then involves sampling the first (or second) continuous time signal (e.g., using an ADC (Analog to Digital Converter)) thereby generating a discrete time signal and extracting I, Q (In-phase, Quadrature) components there from, as shown in a block 2120. After this, the method then involves demodulating the I, Q components and performing symbol mapping of the I, Q components thereby generating a sequence of discrete-valued modulation symbols.

The method then involves performing iterative decoding processing according to a preferred LDPC decoding approach. The method then involves performing edge message updating in accordance with LDPC decoding by performing calculations using min*− processing or max*− processing, as shown in a block 2130.

However, the iterative decoding processing is handled differently in this embodiment than in the embodiment of the preceding diagram. During each iterative decoding iteration, the method of this embodiment involves making hard decisions based on soft information corresponding to most recently updated edge messages with respect to bit nodes to produce current estimate of codeword, as shown in a block 2142. This making of hard decisions during each iterative decoding iteration is performed only after finishing at least one iterative decoding iteration of processing edge messages with respect to bit nodes. That is to say, at least one updating of the edge messages with respect to the bit nodes need to be available to make hard decisions based on the corresponding soft information.

Also, during each iterative decoding iteration, the method involves performing syndrome checking of the current estimate of the codeword. This is performed to determine if the current estimate of the codeword passes the all of the syndromes within an acceptable degree of accuracy, as shown in a block 2150. If the syndrome check does NOT pass during this iterative decoding iteration, the method involves performing at least one additional iterative decoding iteration, as shown in a block 2154. However, if the syndrome check does pass during this iterative decoding iteration (the flow of which is shown in a block 2152), the method involves outputting a best estimate of the codeword (having information bits) that has been extracted from the originally received continuous time signal, as shown in a block 2160.

FIG. 22 is a flowchart illustrating an embodiment of alternative method 2200 for performing min*− (or max*−) processing in accordance with certain aspects of the invention. The method involves calculating a first bit (or first plurality of bits) of a difference between a first value and a second value using finite precision in the digital domain, as shown in a block 2210.

The method then performs multiple operations simultaneously and in parallel with one another. The method involves calculating the remaining bits (or a second plurality of bits), including the MSB (Most Significant Bit), of the difference using finite precision in the digital domain, as shown in a block 2222. This may be viewed as calculating a second plurality of LSBs (Least Significant Bits) of the difference such that this second plurality of LSBs also includes the MSB of the difference. In some embodiments, the number of bits within the first plurality of bits may be viewed as including the bits spanning from the LSB of the difference to the n-th bit; the number of bits within the second plurality of bits may be viewed as including the bits spanning from the n+1-th bit of the difference to the MSB (Most Significant Bit) of the difference. The number of bits included within the first plurality of bits, and the number of bits included within the second plurality of bits may be selectable as determined by a designer of such an architecture implemented in accordance with certain aspects of the invention.

Also, a second of the simultaneously and in parallel operations involves determining a first log correction factor (e.g., ln(+value)), or sometimes referred to as +log_out, using the first bit (or the first plurality of bits) of the difference, as shown in a block 2224. This may involve using the first plurality of LSBs of the difference to perform this determination. This may be performed by selecting the first log correction factor from a LUT (Look-Up Table), as shown in a block 2225. In some embodiments, the first log correction factor is implemented using only a single bit degree of precision.

Also, a third of the simultaneously and in parallel operations involves determining second log correction factor (e.g., ln(−value)), or sometimes referred to as −log_out, using the first bit (or the first plurality of bits) of the difference, as shown in a block 2226. This may also involve using the first plurality of LSBs of the difference to perform this determination as well. This may also be performed by selecting the second log correction factor from a LUT, as shown in a block 2227. In some embodiments, the first log correction factor is implemented using only a single bit degree of precision.

The method then involves selecting either the first log correction factor or the second log correction factor based on the MSB of the difference between the first value and the second value, as shown in a block 2234. As appropriate, this may involve using a min*− log forcing circuit (or a max*− log forcing circuit) whose operation is governed by the remaining bits (or the second plurality of bits) of the difference. The method also involves selecting either the first value or the second value as being the minimum value (or maximum value) using the MSB of the difference, as shown in a block 2232.

The method then also involves outputting the selected log correction factor (either the first log correction factor or the second log correction factor), as shown in a block 2242. The method also involves outputting the selected value (either the first value or the second value) as being minimum (or maximum) value, as shown in a block 2244.

If desired, the selected log correction factor and the selected value (either the first value or the second value) as being minimum (or maximum) value may also be combined to form the final resultant of the min*− or max*− processing performed by this method.

It is also noted that the methods described herein may also be performed within any of the appropriate system and/or apparatus designs (communication systems, communication transmitters, communication receivers, communication transceivers, and/or functionality described therein) that are described herein without departing from the scope and spirit of the invention.

Moreover, it is also noted that the various functionality, system and/or apparatus designs, and method related embodiments that are described herein may all be implemented to perform various calculations in the logarithmic domain (e.g., log domain) thereby enabling multiplication operations to be performed using addition and thereby enabling division operations to be performed using subtraction.

In view of the above detailed description of the invention and associated drawings, other modifications and variations will now become apparent. It should also be apparent that such other modifications and variations may be effected without departing from the spirit and scope of the invention.

What is claimed is:

1. A min*– (min-star-minus) circuit, the circuit comprising:
   a subtraction block that is operable to calculate a difference between a first input value and a second input value such that the difference comprises a first plurality of LSBs (Least Significant Bits) of the difference, a second plurality of LSBs of the difference, and an MSB (Most Significant Bit);
   a first log correction factor block that is operable to determine a first log correction factor based on the first plurality of LSBs of the difference;
   a second log correction factor block that is operable to determine a second log correction factor based on the first plurality of LSBs of the difference;
   a log correction factor MUX (Multiplexor) that is operable to receive the first log correction factor and the second log correction factor as inputs and whose selection is governed by the MSB of the difference;
   an input value selection MUX that is operable to receive the first input value and the second input value as inputs and whose selection is governed by the MSB of the difference;
   wherein an output of the input value selection MUX is a minimum input value selected from among the first input value and the second input value;
   wherein an output of the log correction factor MUX is a final log correction factor; and
   wherein a final min*– resultant, that is based on the first input value and the second input value, comprises the minimum input value and the final log correction factor.

2. The circuit of claim 1, further comprising:
   a min*– forcing circuit that is operable to force the output of the log correction factor MUX to a predetermined value when the MSB of the difference is a value of 0 and all bits of the second plurality of LSBs of the difference are not all 0s.

3. The circuit of claim 1, further comprising:
   a min*– forcing circuit that is operable to force the output of the log correction factor MUX to a predetermined value when the MSB of the difference is a value of 1 and all bits of the second plurality of LSBs of the difference are not all 1s.

4. The circuit of claim 1, wherein:
   the final log correction factor is subtracted from the minimum input value to generate the final min*– resultant that is based on the first input value and the second input value.

5. The circuit of claim 1, wherein:
   during a first time period:
      the subtraction block is operable to calculate the first plurality of LSBs of the difference between the first input value and the second input value; and
   during a second time period:
      the subtraction block is operable to calculate the second plurality of LSBs of the difference between the first input value and the second input value;
      the first log correction factor block is operable to determine the first log correction factor based on the first plurality of LSBs of the difference; and
      the second log correction factor block is operable to determine the second log correction factor based on the first plurality of LSBs of the difference.

6. The circuit of claim 1, wherein:
   during a first time period:
      the subtraction block is operable to calculate the first plurality of LSBs of the difference between the first input value and the second input value;
   during a second time period:
      the subtraction block is operable to calculate the second plurality of LSBs of the difference between the first input value and the second input value;
      the first log correction factor block is operable to determine the first log correction factor based on the first plurality of LSBs of the difference;
      the second log correction factor block is operable to determine the second log correction factor based on the first plurality of LSBs of the difference; and
   during a third time period: and
      the MSB of the difference directs the log correction factor MUX to select either the first log correction factor or the second log correction factor; and
      the MSB of the difference directs the input value selection MUX to select either the first input value or the second input value.

7. The circuit of claim 1, further comprising:
   a LUT (Look-Up Table) that includes a plurality of first log correction factors and a plurality of second log correction factors defined as a function of the first plurality of LSBs of the difference;
   wherein the first log correction factor block looks up the first log correction factor from the LUT based on the first plurality of LSBs of the difference; and
   wherein the second log correction factor block looks up the second log correction factor from the LUT based on the first plurality of LSBs of the difference.

8. The circuit of claim 1, wherein:
   the circuit is contained within a decoder that is operable to decode an LDPC (Low Density Parity Check) coded signal; and
   the circuit is implemented to perform calculations during check node processing that involves updating a plurality of edge messages with respect to a plurality of check nodes corresponding to an LDPC bipartite graph by which the LDPC coded signal is generated.

9. The circuit of claim 8, wherein:
   the LDPC coded signal is a variable code rate signal and is also a variable modulation signal;
   a first symbol of the LDPC coded signal has a first code rate and a first modulation having a first constellation shape and a corresponding first mapping; and
   a second symbol of the LDPC coded signal has a second code rate and a second modulation having a second constellation shape and a corresponding second mapping.

10. The decoder of claim 8, wherein:
    the decoder is operable to decode LDPC coded signals that are compliant with at least one of DVB-S2 (Digital Video Broadcasting Project-Satellite Version 2) standard and recommended practices provided by IEEE (Institute of Electrical & Electronics Engineers) P802.3an (10 GBASE-T) Task Force.

11. A max*– (max-star-minus) circuit, the circuit comprising:

a subtraction block that is operable to calculate a difference between a first input value and a second input value such that the difference comprises a first plurality of LSBs (Least Significant Bits) of the difference, a second plurality of LSBs of the difference, and an MSB (Most Significant Bit);

a first log correction factor block that is operable to determine a first log correction factor based on the first plurality of LSBs of the difference;

a second log correction factor block that is operable to determine a second log correction factor based on the first plurality of LSBs of the difference;

a log correction factor MUX (Multiplexor) that is operable to receive the first log correction factor and the second log correction factor as inputs and whose selection is governed by the MSB of the difference;

an input value selection MUX that is operable to receive the first input value and the second input value as inputs and whose selection is governed by the MSB of the difference;

wherein an output of the input value selection MUX is a maximum input value selected from among the first input value and the second input value;

wherein an output of the log correction factor MUX is a final log correction factor; and wherein a final max*− resultant, that is based on the first input value and the second input value, comprises the minimum input value and the final log correction factor.

12. The circuit of claim 11, further comprising:
a max*− forcing circuit that is operable to force the output of the log correction factor MUX to a predetermined value when the MSB of the difference is a value of 0 and all bits of the second plurality of LSBs of the difference are not all 0s.

13. The circuit of claim 11, further comprising:
a max*− forcing circuit that is operable to force the output of the log correction factor MUX to a predetermined value when the MSB of the difference is a value of 1 and all bits of the second plurality of LSBs of the difference are not all 1s.

14. The circuit of claim 11, wherein:
the final log correction factor is added to the maximum input value to generate the final max*− resultant that is based on the first input value and the second input value.

15. The circuit of claim 11, wherein:
during a first time period:
the subtraction block is operable to calculate the first plurality of LSBs of the difference between the first input value and the second input value; and
during a second time period:
the subtraction block is operable to calculate the second plurality of LSBs of the difference between the first input value and the second input value;
the first log correction factor block is operable to determine the first log correction factor based on the first plurality of LSBs of the difference; and
the second log correction factor block is operable to determine the second log correction factor based on the first plurality of LSBs of the difference.

16. The circuit of claim 11, wherein:
during a first time period:
the subtraction block is operable to calculate the first plurality of LSBs of the difference between the first input value and the second input value;
during a second time period:
the subtraction block is operable to calculate the second plurality of LSBs of the difference between the first input value and the second input value;
the first log correction factor block is operable to determine the first log correction factor based on the first plurality of LSBs of the difference;
the second log correction factor block is operable to determine the second log correction factor based on the first plurality of LSBs of the difference; and
during a third time period: and
the MSB of the difference directs the log correction factor MUX to select either the first log correction factor or the second log correction factor; and
the MSB of the difference directs the input value selection MUX to select either the first input value or the second input value.

17. The circuit of claim 11, further comprising:
a LUT (Look-Up Table) that includes a plurality of first log correction factors and a plurality of second log correction factors defined as a function of the first plurality of LSBs of the difference;
wherein the first log correction factor block looks up the first log correction factor from the LUT based on the first plurality of LSBs of the difference; and
wherein the second log correction factor block looks up the second log correction factor from the LUT based on the first plurality of LSBs of the difference.

18. The circuit of claim 11, wherein:
the circuit is contained within a decoder that is operable to decode an LDPC (Low Density Parity Check) coded signal; and
the circuit is implemented to perform calculations during check node processing that involves updating a plurality of edge messages with respect to a plurality of check nodes corresponding to an LDPC bipartite graph by which the LDPC coded signal is generated.

19. The circuit of claim 18, wherein:
the LDPC coded signal is a variable code rate signal and is also a variable modulation signal;
a first symbol of the LDPC coded signal has a first code rate and a first modulation having a first constellation shape and a corresponding first mapping; and
a second symbol of the LDPC coded signal has a second code rate and a second modulation having a second constellation shape and a corresponding second mapping.

20. The decoder of claim 18, wherein:
the decoder is operable to decode LDPC coded signals that are compliant with at least one of DVB-S2 (Digital Video Broadcasting Project-Satellite Version 2) standard and recommended practices provided by IEEE (Institute of Electrical & Electronics Engineers) P802.3an (10 GBASE-T) Task Force.

21. A method for performing min*− (min-star-minus) processing, the method comprising:
during a first time period:
calculating a first plurality of LSBs (Least Significant Bits) of a difference between a first input value and a second input value;
during a second time period:
calculating a second plurality of LSBs of the difference between the first input value and the second input value;
calculating an MSB (Most Significant Bit) of the difference between the first input value and the second input value;

determining a first log correction factor using the first plurality of LSBs of the difference;

determining a second log correction factor using the first plurality of LSBs of the difference;

during a third time period:

selecting either the second log correction factor or the second log correction factor as being a final log correction value based on an MSB (Most Significant Bit) of the difference; and selecting a minimum input value from among the first input value and the second input value based on the MSB of the difference; and wherein a final min*- resultant, that is based on the first input value and the second input value, comprises the minimum input value and the final log correction factor.

22. The method of claim 21, further comprising:

looking up the first log correction factor block within a LUT (Look-Up Table) based on the first plurality of LSBs of the difference;

looking up the second log correction factor block within the LUT based on the first plurality of LSBs of the difference; and wherein the LUT includes a plurality of first log correction factors and a plurality of second log correction factors defined as a function of the first plurality of LSBs of the difference.

23. The method of claim 21, further comprising:

subtracting the final log correction factor from the minimum input value to generate the final min*- resultant that is based on the first input value and the second input value.

24. The method of claim 21, wherein:

the method is performed within a decoder that is operable to decode an LDPC (Low Density Parity Check) coded signal; and the method is operable to perform calculations during check node processing that involves updating a plurality of edge messages with respect to a plurality of check nodes corresponding to an LDPC bipartite graph by which the LDPC coded signal is generated.

25. The method of claim 24, wherein:

the LDPC coded signal is a variable code rate signal and is also a variable modulation signal;

a first symbol of the LDPC coded signal has a first code rate and a first modulation having a first constellation shape and a corresponding first mapping; and a second symbol of the LDPC coded signal has a second code rate and a second modulation having a second constellation shape and a corresponding second mapping.

26. The method of claim 24, wherein:

the decoder is operable to decode LDPC coded signals that are compliant with at least one of DVB-S2 (Digital Video Broadcasting Project-Satellite Version 2) standard and recommended practices provided by IEEE (Institute of Electrical & Electronics Engineers) P802.3an (10GBASE-T) Task Force.

27. A method for performing max*- (max-star-minus) processing, the method comprising:

during a first time period:

calculating a first plurality of LSBs (Least Significant Bits) of a difference between a first input value and a second input value;

during a second time period:

calculating a second plurality of LSBs of the difference between the first input value and the second input value;

calculating an MSB (Most Significant Bit) of the difference between the first input value and the second input value;

determining a first log correction factor using the first plurality of LSBs of the difference;

determining a second log correction factor using the first plurality of LSBs of the difference;

during a third time period:

selecting either the second log correction factor or the second log correction factor as being a final log correction value based on an MSB (Most Significant Bit) of the difference; and selecting a maximum input value from among the first input value and the second input value based on the MSB of the difference; and wherein a final max*- resultant, that is based on the first input value and the second input value, comprises the maximum input value and the final log correction factor.

28. The method of claim 27, further comprising:

looking up the first log correction factor block within a LUT (Look-Up Table) based on the first plurality of LSBs of the difference;

looking up the second log correction factor block within the LUT based on the first plurality of LSBs of the difference; and wherein the LUT includes a plurality of first log correction factors and a plurality of second log correction factors defined as a function of the first plurality of LSBs of the difference.

29. The method of claim 27, further comprising:

adding the final log correction factor to the maximum input value to generate the final max*- resultant that is based on the first input value and the second input value.

30. The method of claim 27, wherein:

the method is performed within a decoder that is operable to decode an LDPC (Low Density Parity Check) coded signal; and the method is operable to perform calculations during check node processing that involves updating a plurality of edge messages with respect to a plurality of check nodes corresponding to an LDPC bipartite graph by which the LDPC coded signal is generated.

31. The method of claim 30, wherein:

the LDPC coded signal is a variable code rate signal and is also a variable modulation signal;

a first symbol of the LDPC coded signal has a first code rate and a first modulation having a first constellation shape and a corresponding first mapping; and a second symbol of the LDPC coded signal has a second code rate and a second modulation having a second constellation shape and a corresponding second mapping.

32. The method of claim 30, wherein:

the decoder is operable to decode LDPC coded signals that are compliant with at least one of DVB-S2 (Digital Video Broadcasting Project-Satellite Version 2) standard and recommended practices provided by IEEE (Institute of Electrical & Electronics Engineers) P802.3an (10 GBASE-T) Task Force.

* * * * *

UNITED STATES PATENT AND TRADEMARK OFFICE
CERTIFICATE OF CORRECTION

| | |
|---|---|
| PATENT NO. | : 7,383,485 B2 |
| APPLICATION NO. | : 11/172329 |
| DATED | : June 3, 2008 |
| INVENTOR(S) | : Hau Thien Tran et al. |

It is certified that error appears in the above-identified patent and that said Letters Patent is hereby corrected as shown below:

Title Page, Item (63): please rewrite the contents with the following:
--Continuation-in-part of application No. 10/347,732, filed on Jan. 21, 2003, and continuation-in-part of application No. 10/901,528, filed on Jul. 29, 2004, now Pat. No. 7,017,106, which is a continuation of application No. 10/369,168, filed on Feb. 19, 2003, and the present application is a continuation-in-part of application No. 10/865,456, filed on Jun. 10, 2004, which is a continuation-in-part of application No. 09/952,210, filed on Sep. 12, 2001.--

Column 30, line 65, in Claim 10: replace "(10 GBASE-T)" with --(10GBASE-T)--.

Column 32, line 54, in Claim 20: replace "(10 GBASE-T)" with --(10GBASE-T)--.

Column 34, line 65, in Claim 32: replace "(10 GBASE-T)" with --(10GBASE-T)--.

Signed and Sealed this

Twenty-eighth Day of April, 2009

JOHN DOLL
*Acting Director of the United States Patent and Trademark Office*